(12) United States Patent
Sasaki et al.

(10) Patent No.: US 11,855,051 B2
(45) Date of Patent: Dec. 26, 2023

(54) SYSTEM FOR THE CHARACTERIZATION OF EMISSIVE ELEMENTS

(71) Applicant: eLux Inc., Vancouver, WA (US)

(72) Inventors: Kenji Sasaki, West Linn, OR (US); Kurt Ulmer, Vancouver, WA (US); Paul J. Schuele, Washougal, WA (US); Jong-Jan Lee, Camas, WA (US)

(73) Assignee: eLux, Inc., Vancouver, WA (US)

( * ) Notice: Subject to any disclaimer, the term of this patent is extended or adjusted under 35 U.S.C. 154(b) by 218 days.

(21) Appl. No.: 17/591,736

(22) Filed: Feb. 3, 2022

(65) Prior Publication Data

US 2022/0157791 A1 May 19, 2022

Related U.S. Application Data

(60) Division of application No. 16/875,995, filed on May 16, 2020, now Pat. No. 11,315,910, which is a
(Continued)

(51) Int. Cl.
| | |
|---|---|
| *H01L 25/075* | (2006.01) |
| *H01L 23/00* | (2006.01) |
| *H01L 33/38* | (2010.01) |
| *H01L 33/48* | (2010.01) |
| *G01N 21/59* | (2006.01) |
| *H01L 21/66* | (2006.01) |

(52) U.S. Cl.
CPC .......... *H01L 25/0753* (2013.01); *H01L 24/74* (2013.01); *H01L 24/799* (2013.01); *H01L 33/38* (2013.01); *H01L 33/486* (2013.01); *G01N 21/5907* (2013.01); *G01N 2021/5919* (2013.01); *H01L 22/10* (2013.01); *H01L 2224/751* (2013.01); *H01L 2933/0033* (2013.01); *H01L 2933/0066* (2013.01)

(58) Field of Classification Search
CPC .............. G01N 2021/5915; G01N 2021/5919
See application file for complete search history.

(56) References Cited

U.S. PATENT DOCUMENTS

| | | | |
|---|---|---|---|
| 2007/0008540 A1* | 1/2007 | Vanhove | G01N 21/534 356/441 |
| 2010/0225919 A1* | 9/2010 | Birecki | G01N 21/5907 356/442 |
| 2012/0320378 A1* | 12/2012 | Shemer | G01N 21/274 356/432 |

\* cited by examiner

*Primary Examiner* — Robert A Vetere
(74) *Attorney, Agent, or Firm* — Law Office of Gerald Maliszewski; Gerald Maliszewski

(57) ABSTRACT

A method is provided for the selective harvest of microLED devices from a carrier substrate. Defect regions are predetermined that include a plurality of adjacent defective microLED devices on a carrier substrate. A solvent-resistant binding material is formed overlying the predetermined defect regions and exposed adhesive is dissolved with an adhesive dissolving solvent. Non-defective microLED devices located outside the predetermined defect regions are separated from the carrier substrate while adhesive attachment is maintained between the microLED devices inside the predetermined defect regions and the carrier substrate. Methods are also provided for the dispersal of microLED devices on an emissive display panel by initially optically measuring a suspension of microLEDs to determine suspension homogeneity and calculate the number of microLEDs per unit volume. If the number of harvested microLED devices in the suspension is known, a calculation can be made of the number of microLED devices per unit of suspension volume.

5 Claims, 23 Drawing Sheets

Related U.S. Application Data continuation of application No. 16/875,994, filed on May 16, 2020, now Pat. No. 11,296,059, which is a continuation-in-part of application No. 16/846,493, filed on Apr. 13, 2020, now Pat. No. 11,251,166, which is a continuation-in-part of application No. 16/727,186, filed on Dec. 26, 2019, now Pat. No. 11,145,787, which is a continuation of application No. 16/406,196, filed on May 8, 2019, now Pat. No. 10,643,981, which is a continuation-in-part of application No. 16/406,080, filed on May 8, 2019, now Pat. No. 10,804,426, which is a continuation-in-part of application No. 16/125,671, filed on Sep. 8, 2018, now Pat. No. 10,516,084, application No. 17/591,736 is a continuation-in-part of application No. 15/838,536, filed on Dec. 12, 2017, now Pat. No. 10,242,977, which is a continuation-in-part of application No. 15/722,037, filed on Oct. 2, 2017, now Pat. No. 10,543,486, which is a continuation-in-part of application No. 15/691,976, filed on Aug. 31, 2017, now Pat. No. 10,535,640, which is a continuation-in-part of application No. 15/440,735, filed on Feb. 23, 2017, now Pat. No. 10,381,335, which is a continuation-in-part of application No. 15/416,882, filed on Jan. 26, 2017, now Pat. No. 10,446,728, said application No. 15/413,053 is a continuation-in-part of application No. 15/412,731, filed on Jan. 23, 2017, now Pat. No. 10,418,527, said application No. 15/416,882 is a continuation-in-part of application No. 15/413,053, filed on Jan. 23, 2017, now Pat. No. 10,520,769, said application No. 15/412,731 is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 15/266,796, filed on Sep. 15, 2016, now Pat. No. 9,917,226, and a continuation-in-part of application No. 15/221,571, filed on Jul. 27, 2016, now Pat. No. 9,755,110, which is a continuation-in-part of application No. 15/197,266, filed on Jun. 29, 2016, now Pat. No. 10,249,599, which is a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 14/749,569, filed on Jun. 24, 2015, now Pat. No. 9,722,145, said application No. 15/266,796 is a continuation-in-part of application No. 14/680,618, filed on Apr. 7, 2015, now Pat. No. 10,115,862, which is a continuation-in-part of application No. 14/530,230, filed on Oct. 31, 2014, now abandoned.

AGITATED TO ACHIEVE UNIFORM SUSPENSION

SETTLED, t1

SETTLED, t2

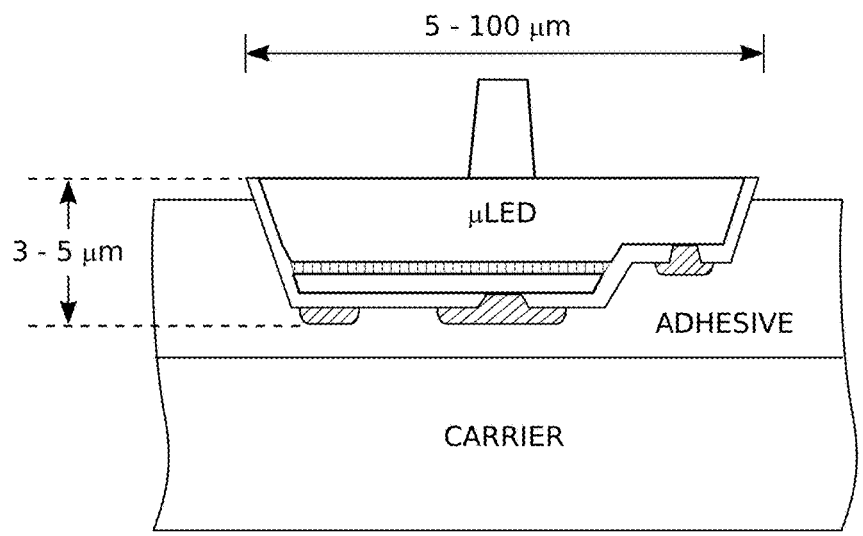
Fig. 6
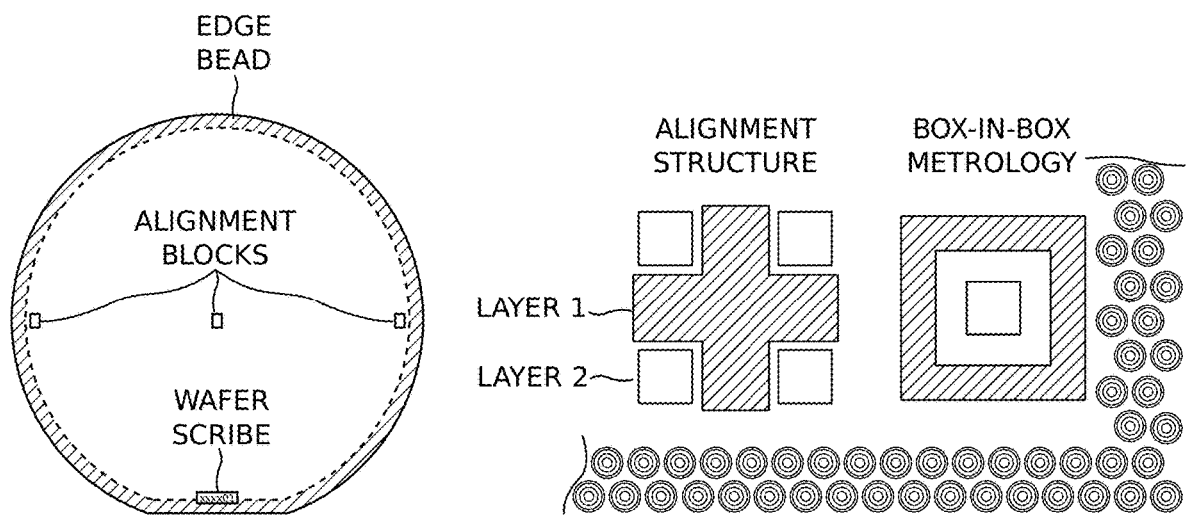
Fig. 7A
Fig. 7B

AGITATE   DRAW   DISPENSE

SYSTEM FOR THE CHARACTERIZATION OF EMISSIVE ELEMENTS

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to light emitting diodes (LEDs) having a size of less than 100 microns and, more particularly, to microLED fabrication processes and systems.

2. Description of the Related Art

A red/green/blue (RGB) display is composed of pixels that emit light at three wavelengths corresponding to the visible colors red, green, and blue. The RGB components of the pixel, each of which is referred to as a sub-pixel, are energized in a systematic way to additively produce the colors of the visible spectrum. There are several display types that produce the RGB images in different ways. Liquid crystal displays (LCD) are the most prevalent technology and they produce RGB images by shining a white light source, typically a phosphor produced white LED, through a color filter of a subpixel. Some portions of the white light wavelengths are absorbed and some transmitted through the color filter. As a consequence, the efficiency of an LCD display may be less than 4% and the contrast ratio is limited by light leaking through the cell. Organic light emitting diode (OLED) displays produce RGB light by direct emission of each of those wavelengths of light at a pixel level within the organic light emitting material. The OLED materials are direct emitting so the display contrast ratio is high, but the organic materials can be subject to long term degradation causing image burn-in.

A third display technology and the one addressed herein is the microLED display, which uses micro-sized (5 to 100 microns (μm) diameter) inorganic LEDs for direct emission of light at the subpixel level. Inorganic microLED displays have several advantages over competing displays. Compared with LCD displays, the microLED display has very high contrast over 50,000:1 and higher efficiency. Unlike the OLED display, inorganic LEDs do not suffer burn-in effects and the achievable brightness is significantly higher.

MicroLEDs are fabricated from metalorganic chemical vapor deposition (MOCVD) wafers like those used to make LEDs for general lighting, which makes the cost per device very low but also introduces some problems that are unique to the microLED technology. The structures used for fluidic assembly of microLEDs have been exhaustively described in parent U.S. Pat. No. 10,643,981, which is incorporated herein by reference. For use in general lighting the most important characteristic of a device is low cost per generated photon, to minimize the cost of each light bulb. That constraint has caused LED fabrication practices to use a process called binning to deal with process variability and defects. Briefly stated, the binning process consists of testing all LEDs after packaging and placing each device in a comparable group with similar efficiency and emission wavelength characteristics, while defective devices are discarded. The binning process allows the MOCVD fabrication to be cheaper because defect reduction and process control methods and costs are minimized.

A recent characterization of 40 μm microLEDs fabricated from typical gallium nitride (GaN) based MOCVD wafers showed that 0.25% of devices were shorted and 0.75% were open. These defects would cause a dark sub-pixel, which is not acceptable for a display product. The microLED is not packaged and the very small size of the device, especially the electrodes, makes device handling and functional test difficult. Because an ultrahigh definition (UHD) display requires at least 24.8 million microLEDs (3×3840×2160) the testing times become astronomical. Therefore, the binning technique is not practical to identify and discard defective microLEDs. Consequently, new structures and methods are required to prevent defective microLEDs from creating defective subpixels. It is possible to remove a defective microLED and replace it as has been described in parent applications Ser. Nos. 16/125,671, 16/595,623, and 16/693,674, which are incorporated herein by reference, but the mechanical pick-and-place tools are expensive to buy and operate. It would be more desirable to identify defective microLEDs and prevent them from entering the suspension used for fluidic assembly.

LEDs used for general lighting are much larger than those used for microLED displays (up to 3-4 millimeters (mm) per side versus 5 to 100 μm in diameter) so the patterning and electrode requirements are significantly different. MicroLEDs are bonded to the substrate electrodes using either a solder material or an asymmetric conductive film (ACF), while large general lighting LEDs are often connected by wire bonding or solder paste on a lead frame. Because the microLEDs are quite small, the techniques for handling devices and especially for assembling microLED displays are quite different from those which have been developed for the very large LEDs used in general lighting.

To fabricate a microLED display, green and blue GaN microLEDs are fabricated on a sapphire substrate and red aluminum gallium arsenic phosphide (AlGaAsP) microLEDs are fabricated on a GaAs substrate. After fabrication and segmentation, the microLEDs must be transferred to a second substrate that becomes the emissive display. The second substrate can be a silicon (Si) wafer (or chip) with built-in control circuitry, or it can be a substrate of glass or flexible plastic with thin film transistors. The conventional method of transfer is a mechanical pick-and-place system, which uses a pickup head to capture a device and position it on the display substrate. Other mechanical transfer methods that use a stamp or the like to transfer a block of microLEDs at the same time are referred to as mass transfer. An alternate technology, as described herein, uses a fluidic assembly process to position the microLEDs.

Briefly stated, the fluidic assembly process applies a liquid suspension of microLEDs to a substrate with an array of trap sites (wells) and moves the suspension to cause the microLEDs to be assembled in the trap sites. For fluidic assembly to succeed, it is necessary to harvest microLEDs from the growth substrate without including defects, formulate a suspension with a known concentration of microLEDs, and then dispense the suspension uniformly over the display substrate.

The handling of micron-scale particle suspensions is well established for systems like cell cultures in the biological sciences or abrasive slurry in industrial applications. In all cases, the objective of the suspension handling system is to achieve a highly homogeneous suspension and transfer the suspension to the target process with a high degree of control over volume and concentration. Suspension uniformity is generally achieved through direct mechanical mixing with a submerged impeller, or by active circulation via pump. Transfer of the well-mixed suspension to a target process is generally done via tubing with pumping downstream of the supply tank, or by pressurizing a sealed tank. Volumetric control for well-suspended systems is achieved by controlling flow rates with pressure differentials and metering net flow with valve timing. It may be desirable to control the suspension concentration, especially when the suspension is being reused, and therefore it is common for transfer tubing to include fittings with multiple inputs so that neat carrier fluid may be balanced with the suspension.

Unfortunately, the conventional techniques for suspension handling are not compatible with the properties of microLEDs or the requirements of the fluidic assembly technology. Specifically, the microLED suspensions have distinguishing characteristics described below that necessitate the development of an alternative approach.

FIG. 1 depicts a microLED suspension with a uniform distribution after agitation that settles to about half the liquid column height after time t1, and is completely settled after time t2. Unlike abrasive slurries, which are formulated to extend homogeneous mixing and have settling times measured in months, microLED suspensions are formulated to have a relatively short settling time. MicroLEDs must settle to the target substrate surface for assembly to take place, so microLED suspensions for fluidic assembly generally settle completely in minutes and lose uniformity very quickly after cessation of mixing. As an example, the disk shaped microLEDs 42 μm in diameter by 5 μm thick, fabricated following the center mesa design presented in parent application Ser. No. 16/406,080 (incorporated herein by reference), have a hydrodynamic diameter of 18.9 μm. Objects of this size have a terminal velocity in liquid when the force of gravity is balanced by the viscosity of the liquid according to the following equation:

$$v_T = \frac{gD_{LED}^2(\rho_{LED} - \rho)}{18\mu}$$

where $D_{LED}$ is the hydrodynamic diameter, $\rho$ is the liquid density, $\rho_{LED}$ is the microLED density, and $\mu$ is the liquid viscosity. For water, the terminal velocity is 1.1 millimeters per second (mm/sec), so in a typical container like a 50 milliliter (ml) Falcon tube the microLEDs settle completely in a minute or so.

MicroLEDs generally have surfaces that include metal, inorganic, and organic materials. As such, it is nearly impossible to prevent temporary stiction to solid surfaces in contact with the microLED suspension. As a consequence, containers holding microLED suspensions are typically fabricated from hydrophobic materials such as acetal homopolymer, polytetrafluoroethylene (PTFE), polypropylene, and the like to minimize stickiness. The final state in FIG. 1 shows the effect of the interaction between microLEDs and the wall of the container where the bottom cone is less than the angle of repose, so some microLEDs stick to the walls of the vessel and do not settle to a uniform layer at the bottom.

Microbes in biological applications are generally sturdy enough to survive internal mixing (such as with a stir bar) without lysing, and industrial abrasive suspensions such as chemical mechanical polish (CMP) slurries are suspended by drum circulation or impeller mixing without damage. In contrast, microLEDs are friable and can be fractured from direct mechanical mixing or pumping. A broken microLED is similar in major dimension to a good microLED, so it cannot be removed from the suspension by filtering, and it interferes with fluidic assembly by partially blocking a trap site.

MicroLEDs represent a large fraction of the cost to manufacture a display, and inefficiencies in μLED utilization and recapture strongly influence cost. Contrasted to biological and industrial abrasive applications, the components in suspension are significantly more valuable.

Unlike conventional suspensions, the performance characteristics of each individual microLED are important because each device makes up one sub-pixel. It is necessary to strictly control the population of microLEDs available for assembly to control the emission distribution of the completed display. As such, suspension handling must be designed to prevent cross-contamination.

MicroLED properties and the stringent requirements for display fabrication rule out the conventional industrial systems and methods of suspension handling. Controlled and efficient dispense of clean, high-quality components is critical to fluidic assembly because the forces involved in fluidic assembly are limited by the threshold at which assembled components become detrapped. Rapid fluidic assembly then, relies on short travel paths on the substrate between microLEDs and their eventual assembly (trap) site. Optimal dispense of the microLED suspension onto the display substrate must therefore not only be low-loss and damage free, but also fast and highly uniform.

It would be advantageous if harvest and dispersal methods existed that were specifically tailored to the handling of inorganic microLEDs used in fluidic assembly.

SUMMARY OF THE INVENTION

Described herein are systems and methods for formulating and manipulating a micro-light emitting diode (microLED) suspension that are suitable for the fluidic assembly of microLED displays. A selective harvest method produces a microLED suspension composed of known good LEDs at a well determined concentration in an appropriate liquid. The microLED suspension is supplied to the display substrate using a dispensing system which minimizes damage and loss of microLEDs while producing a uniform distribution of devices at a controlled density over the display substrate. This optimum initial condition is essential for successful fluidic assembly of microLED displays.

Accordingly, a method is provided for the selective harvest of microLED devices from a carrier substrate. The method provides inorganic microLED devices attached to a carrier substrate with an adhesive. Defect regions are predetermined (e.g., an edge bead) that include a plurality of adjacent defective microLED devices. A solvent-resistant binding material is formed overlying the predetermined defect regions and exposed adhesive is dissolved with an adhesive dissolving solvent. Some examples of an adhesive dissolving solvent include acetone, toluene, trichloroethane, N-methylpyrrolidone (NMP), xylene, cyclohexanone, butyl acetate, or combinations thereof.

Non-defective microLED devices located outside the predetermined defect regions are separated from the carrier substrate while adhesive attachment is maintained between the microLED devices inside the predetermined defect regions and the carrier substrate. In response to separating the microLED devices from the carrier substrate, functional microLED devices are collected in a harvesting container. In one variation, only certain sections of the carrier substrate are exposed to the adhesive dissolving solvent, so that microLEDs are only separated from the selectively exposed sections of the carrier substrate.

Further, the carrier substrate may be inspected to locate defective microLED devices in non-predetermined defect regions, and the solvent-resistant binding material may also be formed overlying these non-predetermined defect regions. In one aspect, inspection may locate non-predetermined solitary defective microLED devices, and a laser trimming process may be used to eject the solitary defective microLED devices. The inspection may be carried out using optical comparison, electroluminescence, photoluminescence, or cathodoluminesence testing.

The microLED devices collected in the harvesting container are typically a suspension of functional microLED devices having an average cross-sectional dimension s. However, impurities also exist in the suspension fluid. In one aspect, a filtering process using a mechanical mesh, elution, fractionation, or combinations thereof, is performed to remove impurities having a maximum cross-sectional dimension greater than t, where t>s. Likewise, a separate filtering process may remove impurities having a maximum cross-sectional dimension less than p, where p<s. In one aspect prior to filtering, the adhesive dissolving solvent in the harvested microLED suspension is replaced with a filtering solution having a lower viscosity than the adhesive dissolving solvent. Alternatively, or after filtering, the fluid in the harvested microLED suspension can be replaced with an assembly solution having either a lower polarity or a higher evaporation rate. In one aspect, a surfactant may be added such as anionic, cationic, non-ionic surfactants, or combinations thereof.

A method is also provided for the dispersal of microLED devices on an emissive display panel. The above-described suspension of harvested microLED devices is transferred to a transparent first container and agitated. Some examples of an agitation process include external vibration of the first container, creating a fluid flow in the suspension, and the flowing a gas through the first container. The suspension opacity is optically measured at a plurality of first container heights to determine suspension homogeneity. When the determined homogeneity is greater than a homogeneity minimum threshold, the suspension can be dispersed on the top surface of an emissive display panel. Some examples of dispersion processes include single-step mass decantation, multi-step pipette translation, nozzle limited container translation, and translating tube.

If the number of harvested microLED devices in the suspension is known, a calculation can be made of the number of microLED devices per unit of suspension volume. As a result, a known first number of microLED devices can be deposited on the emissive display panel in response to dispersing a first volume of suspension. Advantageously, after determining the number of assembly sites in a first region of the emissive display panel top surface, the deposited known first number of microLED devices is at least equal to the number of assembly sites in the first region.

The optical measurement of the suspension opacity is performed by arranging a plurality of light emitting devices having predetermined output light intensity, directed towards a center axis of the first container, and spaced a first predetermined distance from each other along a first vertical axis. A plurality of light detection devices are spaced the first predetermined distance from each other along a second vertical axis, with each light detection device having an input directed towards a corresponding light emitting device output. Then, a comparison is made of the intensities of light received by the light detection devices.

In one aspect, in response to determining the suspension opacity at a plurality of first container heights, a first number of microLED devices per unit of suspension volume can be calculated. Subsequent to dispersing an aliquot volume of suspension onto an emissive display panel top surface, the optical measurements can be repeated to calculate a second number of microLED devices per unit of suspension volume. If a known aliquot volume of suspension is transferred to a second container and a predetermined amount of fluid is added to (or removed from) the second container, it is possible to calculate a third number of microLED devices per unit of suspension in the second container. If fluid is added to (or removed from) the suspension in the first container, then subsequent to agitating the suspension, the suspension density can be optically measured again to calculate a fourth number of microLED devices per unit of suspension volume.

Additional details of the above-described methods, as well as systems for segregating regions of a microLED carrier substrate, harvesting microLEDs, characterizing a microLED suspension, are presented below.

BRIEF DESCRIPTION OF THE DRAWINGS

FIG. 6 is a partial cross-sectional view of a typical microLED on a carrier wafer after device processing is complete.

FIGS. 7A and 7B depict wafer maps of known defect locations from microLED processing (FIG. 7A) and typical alignment structures (FIG. 7B).

DETAILED DESCRIPTION

Figure 2:
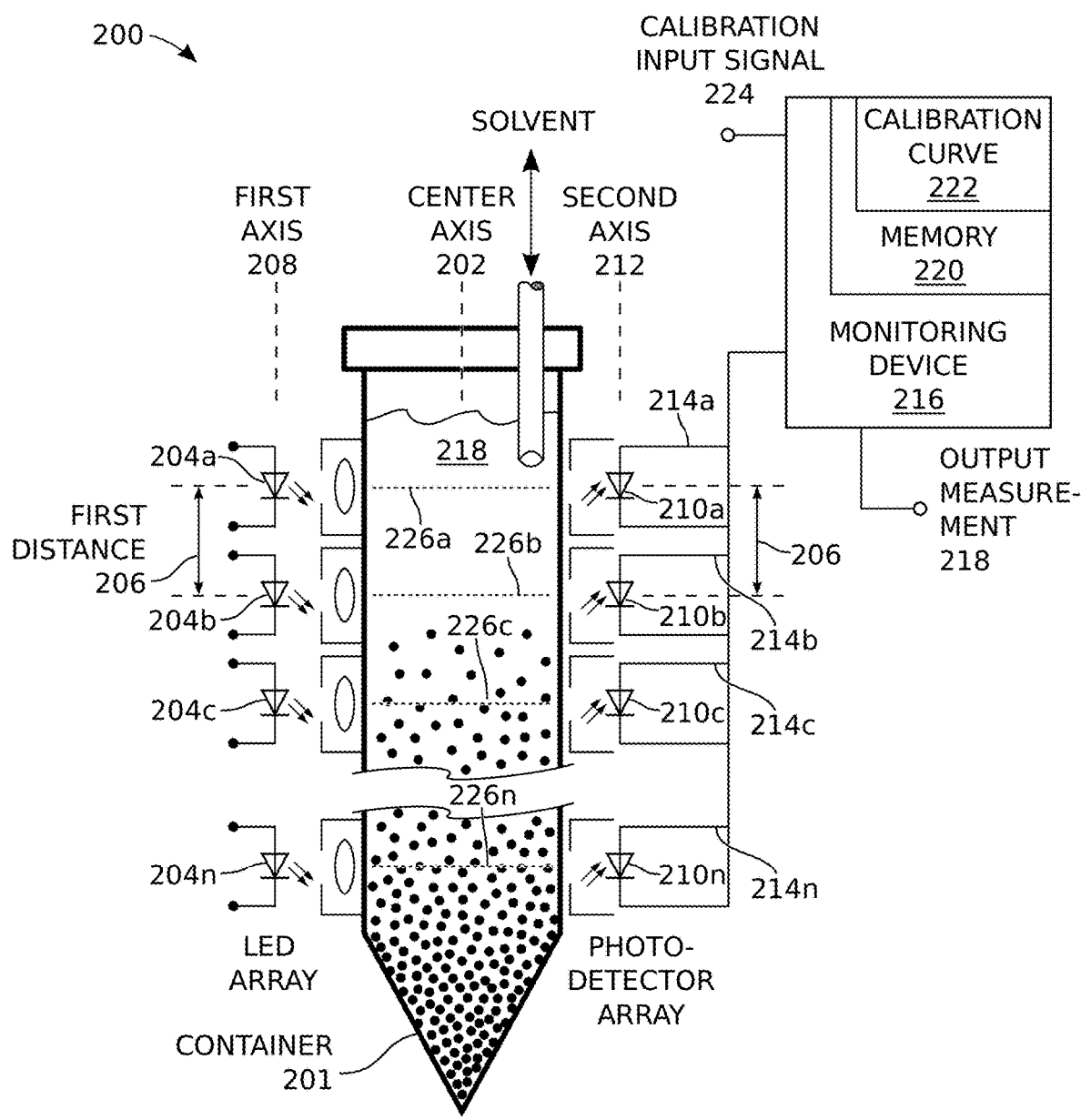
FIG. 2 is a partial cross-sectional view of a system for characterizing a micro-light emitting diode (microLED) suspension.

FIG. 2 is a partial cross-sectional view of a system for characterizing a micro-light emitting diode (microLED) suspension. The system 200 comprises a transparent container 201 having a vertical center axis 202. A plurality of light emitting devices 204a through 204n (LED array) is shown with each light emitting device having a predetermined output light intensity, directed towards the center axis 202 of the container 200 and spaced a first predetermined distance 206 from each other along a vertical first axis 208 parallel to the center axis 202, where (n) is an integer greater than 1. A plurality of light detection devices 210a through 210n (photodetector array) is spaced the first predetermined distance 206 from each other along a vertical second axis 212 parallel to the center axis 202. The light detection devices 210a -210n each have an optical input directed towards a corresponding light emitting device output and an output, respectively on lines 214a through 214n, to provide an electrical optical density signal responsive to measured light intensity. A monitoring device 216 has an input to accept the optical density signals 214a -214n. The monitoring device 216 compares the intensities of light associated with the optical density signals and supplies an output on line 218 responsive to the comparison. In the interest of simplicity, the figure shows the number of light emitting devices equal to the number of light detection devices, with identical spacings. Further, the light emitting devices output the same intensity of light. However, it should be understood that once calibrated, a similar system may be enabled without these explicit limitations.

The container 201 includes a suspension 218 of microLEDs. The monitoring device 216 is able to supply either a microLED homogeneity measurement, or a calculation of the microLED count per unit volume of suspension on line 218 as determined from the homogeneity (density) measurement. In one aspect, the monitoring device 216 includes a non-transitory memory 220 with a stored calibration curve 222. In this case, the monitoring device 216 is able to supply a microLED count per unit volume of suspension on line 218 in response to comparing the optical density signals on lines 214a -214n to the calibration curve 222. As a component of the calibration curve, in one aspect the monitoring device 216 is able to receive and store data concerning the volume of the container 201.

In another aspect, the monitoring device 216 has an input on line 224 to accept a calibration input signal representing the total number of microLEDs in the suspension, in which case the monitoring device is able to supply a microLED count per unit volume of suspension in response to comparing the optical density signals 214a -214n to the total number of microLEDs. The total number of microLEDs may be known, for example, by taking a count of the number of functional microLEDs harvested from a carrier substrate. The input on line 224 may alternatively, or in addition, accept a running measurement of suspension volume.

In one variation, the monitoring device 216 accepts sets of optical density signals 214a -214n collected over a period of time and supplies an output on line 218 of either microLED settling time or microLED size. Further, the container 200 may be divided by a plurality of graduations 226a through 226n and may include a homogeneous suspension of microLEDs (the suspension 218 shown is not homogeneous). In this case, the light detection devices 210a -210n detect changes in the level of suspension as measured against the container graduations 226a -226n. The monitoring device supplies an output on line 218 of either the number of microLED devices dispersed from the container 200 or a volume of suspension dispersed from the container. Advantageously, this output can be supplied in real-time.

To aid in the above-described measurements, an agitation means may be used to homogenize the suspension. A number of homogenization mechanisms are described in more detail below. In one aspect as shown, a solution (solvent) or gas can be used to mix the suspension. Knowing the suspension volume, the agitation mechanism can be tuned for optimized mixing.

Figure 3A:
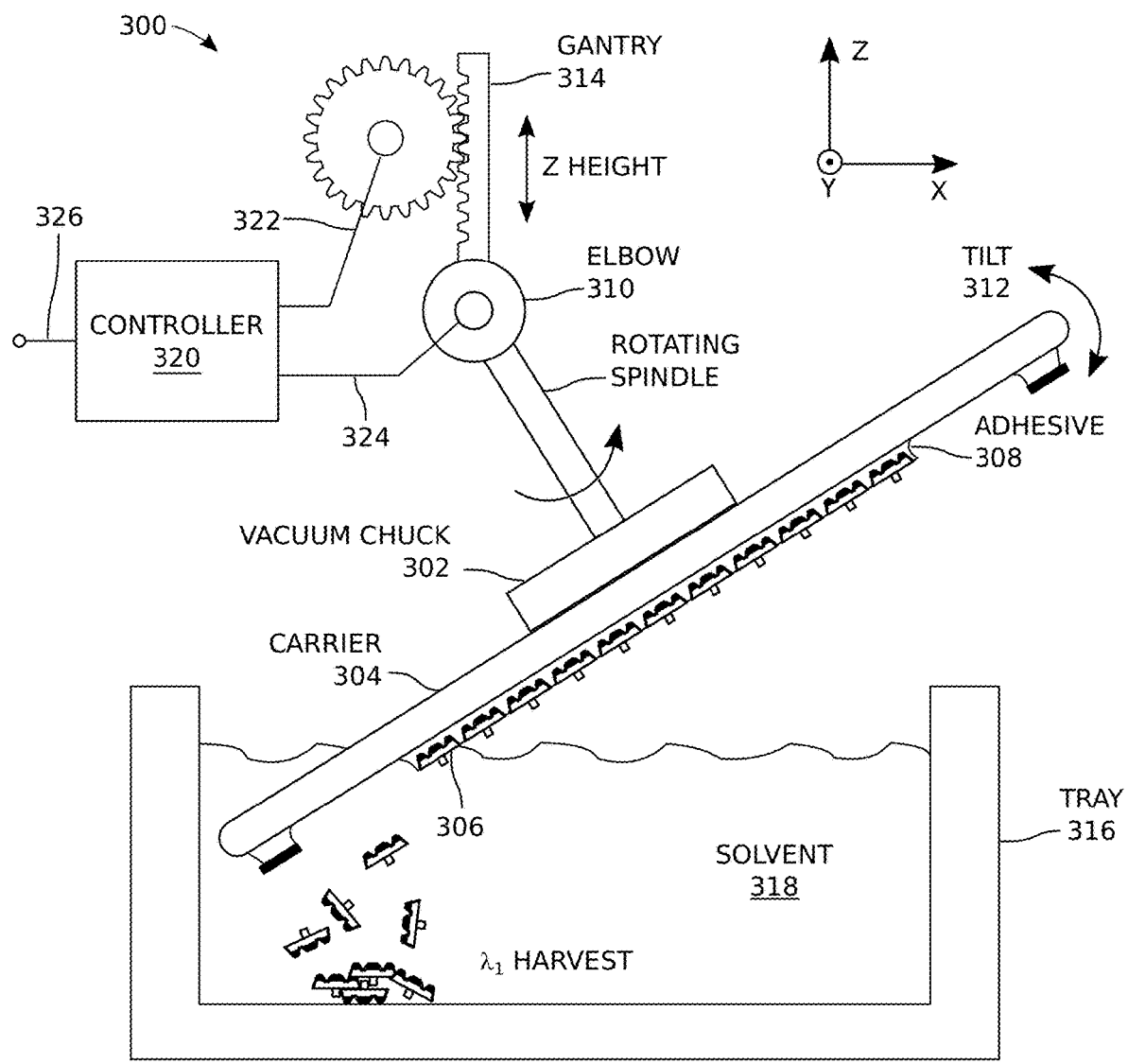
FIGS. 3A and 3B are partial cross-sectional schematic views of components in a system for selectively harvesting microLED devices from a carrier substrate.
Figure 3B:
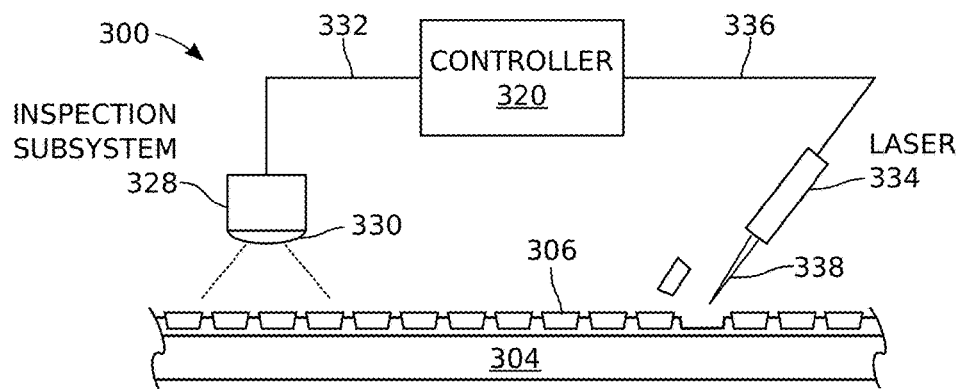

FIGS. 3A and 3B are partial cross-sectional schematic views of components in a system for selectively harvesting microLED devices from a carrier substrate. As shown in FIG. 3A, the system 300 comprises a turntable or vacuum chuck 302 having a rotating (spindle) interface for mounting a carrier substrate 304 comprising inorganic microLED devices 306 attached to the carrier substrate with an adhesive 308. An elbow 310 is connected to the rotating vacuum chuck 302, with a plurality of selectable settings for determining an angle (tilt) 312 of turntable rotation in an xz-axes plane. A gantry 314 is connected to the elbow 310, with a plurality of selectable settings for determining the height of the turntable along a z-axis. A tray 316 includes an adhesive dissolving solvent 318 and has a top opening to accept the carrier substrate 304. A controller 320 has outputs connected to the gantry 314 and elbow 310, respectively on lines 322 and 324, supply the height and angle settings. As shown, the system 300 permits selected radial sections of the carrier substrate 304 to be exposed to the adhesive dissolving solvent 318 in response to the gantry 314 and elbow 310 settings. MicroLED devices 306, separated from the selectively exposed sections of the carrier substrate 304, are harvested in the tray 316. In this example the $\lambda_1$ region of the carrier substrate is being harvested (see FIG. 10)

In one aspect, the controller 320 has an input on line 326 to accept a first map of microLED performance regions, and supplies gantry 314 and elbow 310 settings selecting radial regions of the carrier substrate 304 for exposure to adhesive dissolving solvent, in response to the first map.

As shown in FIG. 3B, the system 300 may comprise an inspection subsystem 328 having an optical input 330 and an output on line 332 connected to the controller 320 for the identification of individual defective microLED devices 306 on the carrier substrate 304. A trimming laser 334 has an input on line 336 connected to the controller 320 to accept a second map of defective microLED devices and an output 338 to eject through radiation, defective microLED devices from the carrier substrate 304 in response to the second map.

Figure 1:
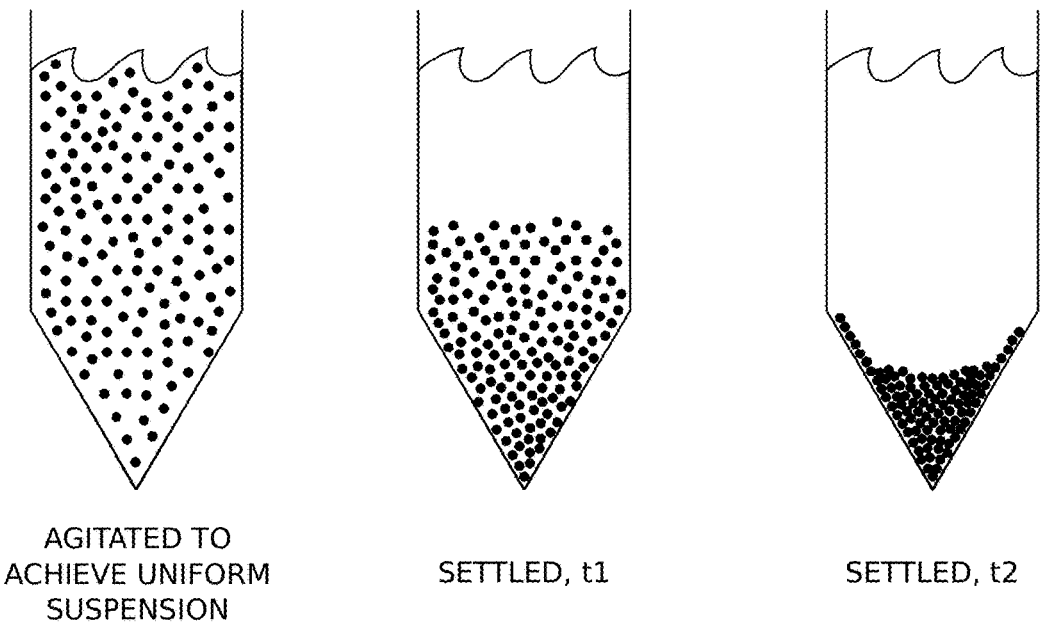
FIG. 1 depicts a microLED suspension with a uniform distribution after agitation that settles to about half the liquid column height after time t1, and is completely settled after time t2.
Figure 4:
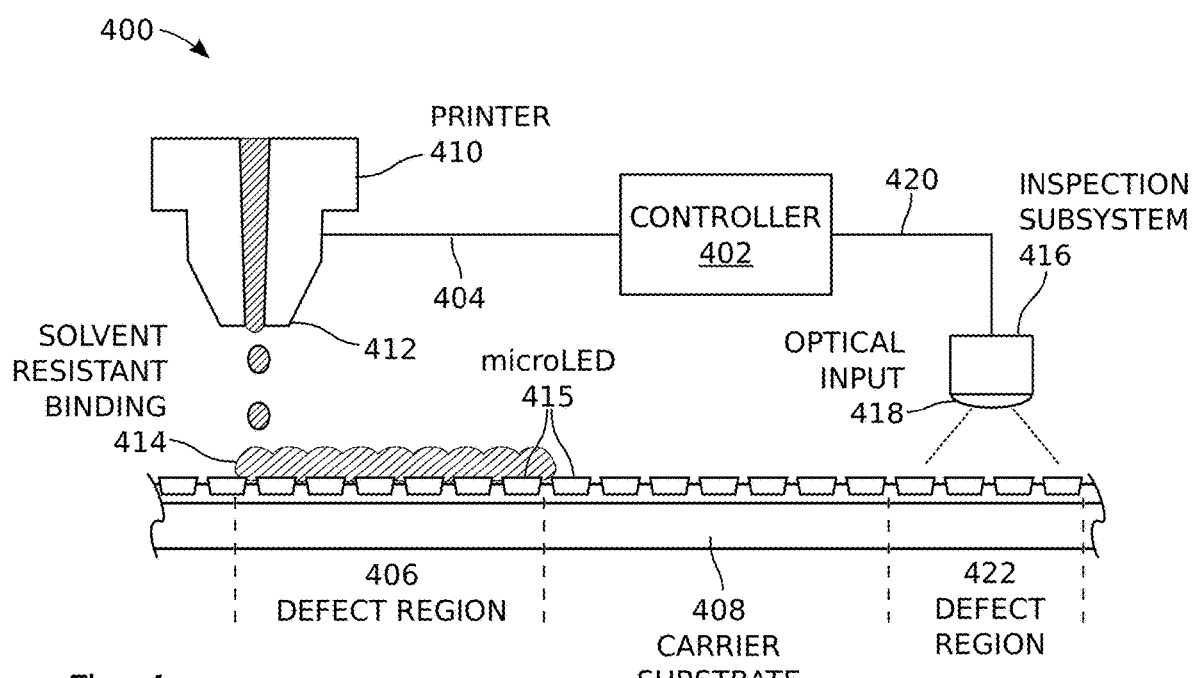
FIG. 4 is a partial cross-sectional view of a system for selectively segregating regions of a microLED carrier substrate.

FIG. 4 is a partial cross-sectional view of a system for selectively segregating regions of a microLED carrier substrate. The system 400 comprises a controller 402 that has an output on line 404 to supply a first map of a predetermined defect region 406 on a carrier substrate 408. A printer 410 has an input on line 404 to accept the first map and a nozzle 412 to apply a solvent-resistant binding material 414 to selected regions of the carrier substrate 408 in response to the first map. MicroLEDs 415 in the selected region 406 remain attached to the carrier substrate 408 despite exposure to an adhesive dissolving solvent (not shown). Some examples of solvent-resistant binding material 414 include SU-8, epoxy resin, polyethylene terephthalate (PET), acrylonitrile butadiene styrene (ABS), and polyimide.

Optionally, system 400 may further comprise an inspection subsystem 416 having an optical input 418 and an output connected to the controller on line 420 identifying a non-predetermined defective microLED device region 422 on the carrier substrate 408. The printer input on line 404 is able to accept a second map of the non-predetermined defective microLED device region 422 from the controller 402 and apply the solvent-resistant binding material to detected defective microLED device region 422 (binding material not yet applied in the figure) in response to the second map.

Figure 5:
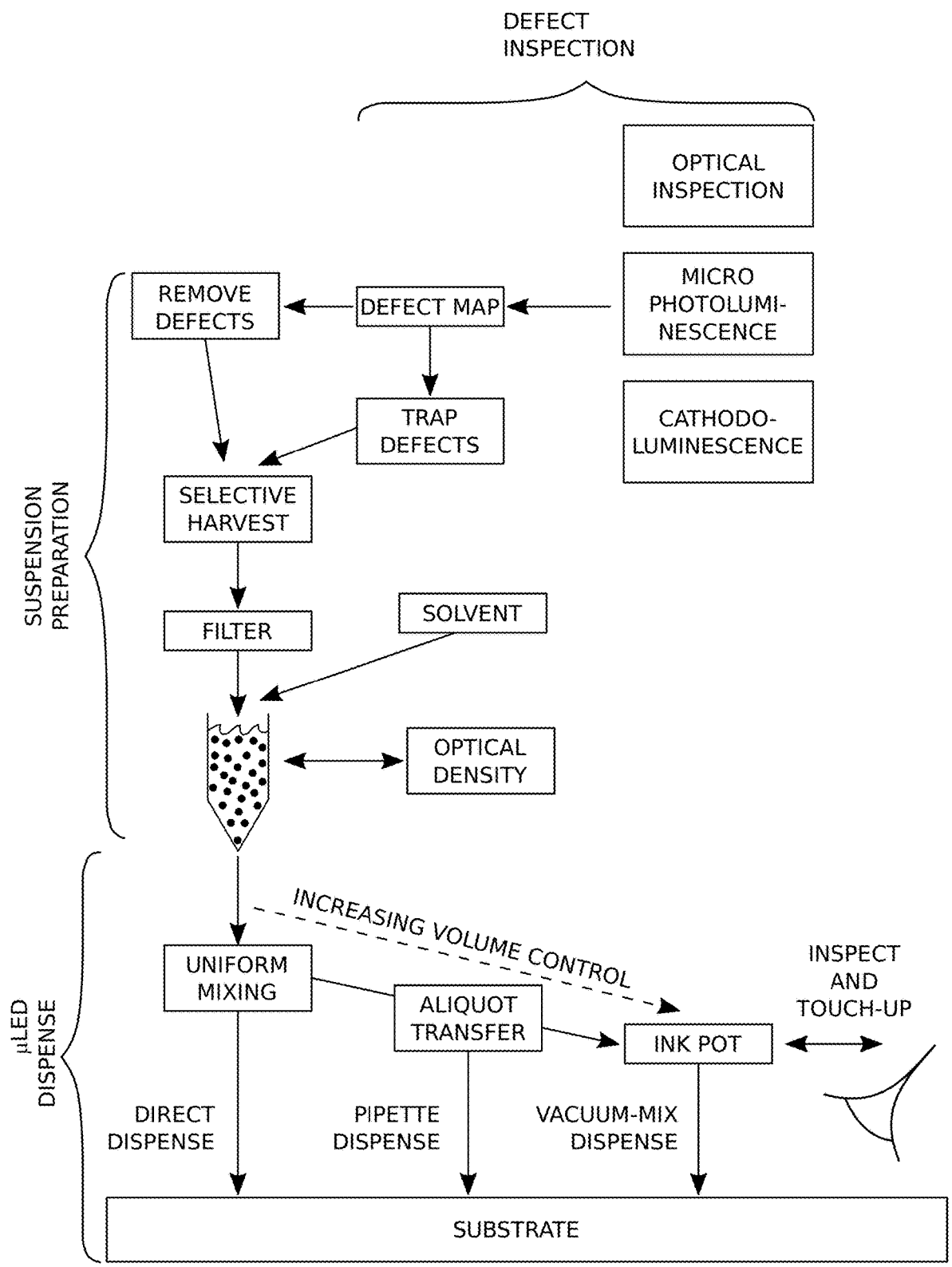
FIG. 5 is a schematic drawing depicting the preparation of a microLED population for fluidic assembly as consisting of three successive steps.

FIG. 5 is a schematic drawing depicting the preparation of a microLED population for fluidic assembly as consisting of three successive steps. First, the incoming microLED wafers are inspected to determine the locations of defective microLEDs. Based on the defect map, defective microLEDs and other debris are either removed from the carrier substrate or encapsulated to prevent them from being harvested into the suspension. The carrier wafer is then immersed in a solvent to dissolve the adhesive holding the known good microLEDs onto the substrate and the microLEDs are rinsed into a holding container. The solvent with dissolved adhesive is carefully decanted after allowing the microLEDs to settle and several solvent exchanges are carried out to remove the remaining adhesive residue. The resulting suspension is filtered to remove particles with a size significantly different than the microLEDs, and the amount of solvent is adjusted so that the density of microLEDs in suspension is appropriate for subsequent mixing and dispense operations.

Using the suspension of microLEDs, three alternate dispensing systems that take different approaches with varying tradeoffs for dispense speed, volume control, and complexity can be used to apply microLED suspension to the display substrate. In each case several separate aliquot transfers are made to cover the substrate. An aliquot transfer may either be directly to the substrate or through a controlled volume intermediate in the form of the 'Ink Pot' that enables both the diluting of the suspension and the use of a dispense head actively mixing the microLED suspension prior to dispense onto the substrate. For sufficiently long-settling time suspensions, the direct transfer is preferred. Finally, the substrate can be inspected for uniformity and additional small area dispenses can be used to fill in low density areas.

FIG. 6 is a partial cross-sectional view of a typical microLED on a carrier wafer after device processing is complete. MicroLEDs are typically fabricated on sapphire substrates and transferred to a carrier wafer using laser lift off (LLO) as described in parent patent U.S. Pat. No. 10,643,981, which is incorporated herein by reference. The resulting wafer has millions of microLEDs embedded in an adhesive layer on a carrier wafer as shown. Unfortunately, the wafer will also have several different defect types (including process control structures) that adversely affect subsequent processing, so selective harvest is used to ensure that the fluidic assembly process can be carried out using only known good microLEDs.

FIGS. 7A and 7B depict wafer maps of known defect locations from microLED processing (FIG. 7A) and typical alignment structures (FIG. 7B). The device processing to fabricate microLEDs has several known defects or process control structures that occur systematically in the same location because of the nature of the process as shown. Each wafer has an identifying mark scribed near the edge of the wafer, which creates pits in the substrate surface that disrupt the microLED pattern. Each of the several processing steps that form the microLED structure uses a photoresist coating to transfer a pattern to the wafer. Photoresist coating is not perfect, so the edge of the wafer has pattern defects in a ring shape known as the edge bead. The photolithography process uses a series of marks to locate each layer with respect to previous layers. The resulting alignment marks and metrology structures (FIG. 7B) are necessary for fabrication but are defects if included in solution with the harvested microLEDs. These defective areas are much larger than the typical microLED size and the edge bead exclusion ring may be as wide as 2-3 mm. The first component of a wafer defect map is the size and location of these large systematically placed structures.

A second class of defects are random processing defects such as chemical mechanical polish (CMP) scratches on the substrate, large residual gallium nitride (GaN) blocks caused by fall-on particles in isolation etch, missing metal electrodes, and the like. These larger defects can be identified by optical scanning, which compares adjacent images for differences that do not match the expected microLED pattern. This component of the defect map consists of a series of coordinates outlining each defective area and the size of the defect.

The most important class of defects is functional defects that affect the electrical properties and optical emission of a microLED. Mapping these defects can be accomplished by four different complimentary techniques.

1) Perhaps the most desirable technique is an electroluminescence (EL) test that probes each microLED and measures the resulting emission. This test directly identifies weak devices with low emission, as well as shorted or open devices. The disadvantage is that the technique is slow and it is difficult to probe the small electrodes, especially without damaging the electrode surface. It is possible that this technique can be used to measure a few representative devices and a region of a wafer can be added to the defect map because of low fluence or the wavelength of emission being off target.
2) Micro photoluminescence (PL) applies a light source, typically a laser, at a wavelength that excites transitions in the LED structure and measures the wavelength and intensity of the resulting emission. This technique can identify metalorganic chemical vapor deposition (MOCVD) defects, as well as cracked or shorted devices, but it cannot identify missing metal or open contacts.

3) With optical comparison the usual method is to compare two images and look for differences between them, with the difference being a defect. An optical image can also be compared to a pattern (the-to-database).

4) Cathodoluminescence (CL) is described below.

Figure 8:
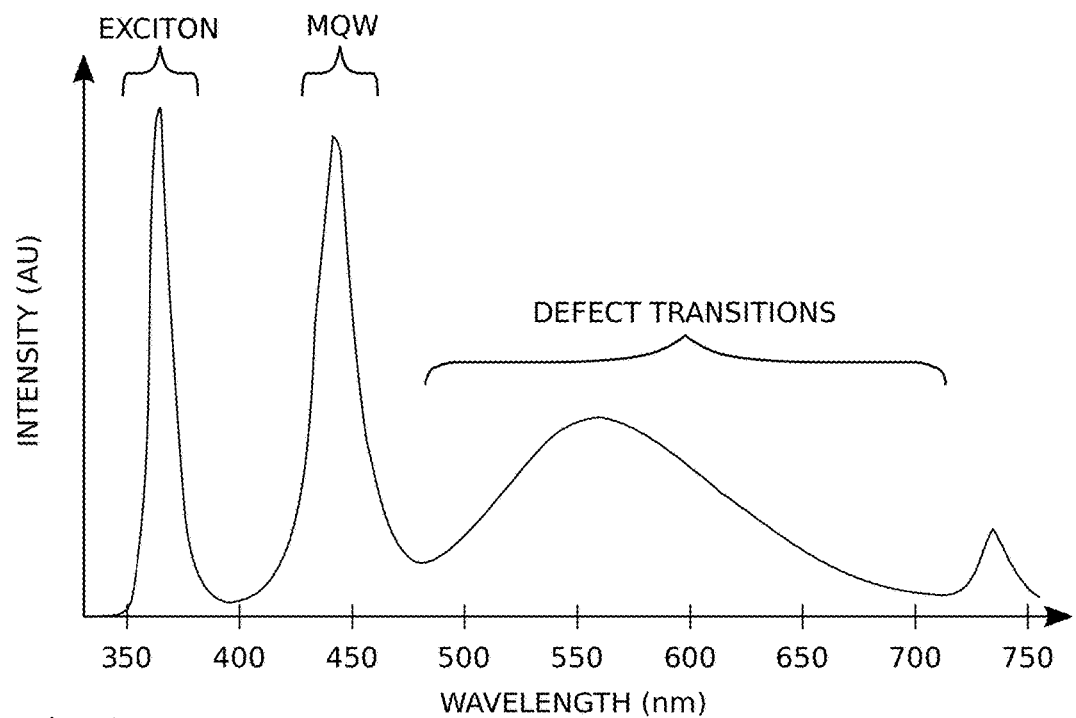
FIG. 8 is a graph depicting GaN microLED cathodoluminesence spectra.

FIG. 8 is a graph depicting GaN microLED cathodoluminesence spectra. Micro cathodoluminescence uses an electron beam from a scanning electron microscope (SEM) to excite transitions in the LED structure and measures the wavelength and intensity of the resulting optical emission. GaN microLEDs have multiple characteristic emission lines as shown, so differences in spectra can identify different defect mechanisms. A weak or absent emission peak at 455 nm indicates a shorted LED or a problem with the MQW. Higher defect emission in the broad peak around 570 nm can indicate etch damage or poor quality of the n-GaN. Low intensity of the exciton peak can also indicate poor quality of the initial growth or missing dopant. Any serious deviation from a typical microLED spectrum probably indicates a device that will not perform well in a display.

Figure 9:
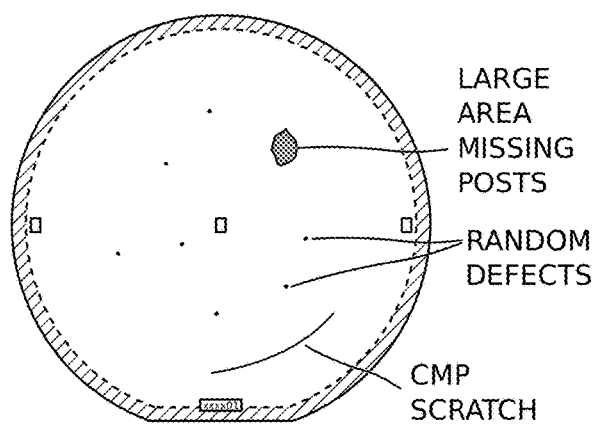
FIG. 9 is a composite defect map that can be used to guide the defect control processes.

FIG. 9 is a composite defect map that can be used to guide the defect control processes. The functional tests identify individual microLEDs with defects, so this portion of the defect map consists of the X-Y coordinates of each defective LED. The electroluminescence and photoluminescence mapping techniques can also produce a map of the LED performance characteristics including emission wavelength, efficiency, and threshold voltage. Using these techniques, it is possible to identify regions with different performance so the selective harvest technique can be adapted to harvest smaller regions of the wafer to produce a microLED suspension with a tighter distribution of uniformity in device performance.

Figure 10:
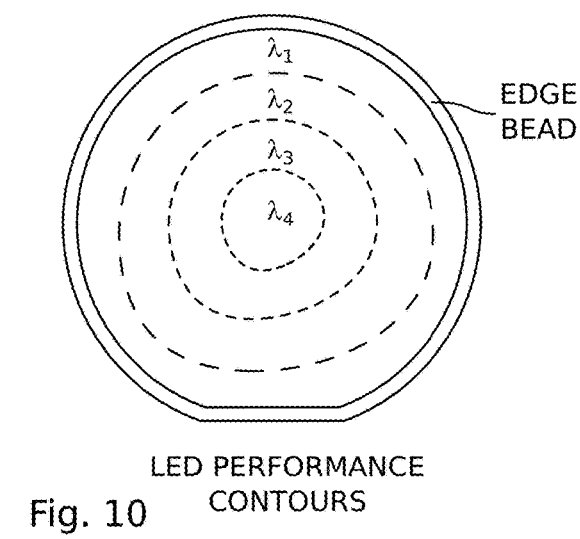
FIG. 10 is a plan view of a wafer where emission wavelength is shown as equal width contours.

FIG. 10 is a plan view of a wafer where emission wavelength is shown as equal width contours. In some cases it is desirable to harvest each radial band of the carrier substrate separately, so that separate suspensions (e.g., four bands as shown) each have a narrow wavelength or efficiency distribution. This simple binning technique can be used to produce displays with improved color mura by combining suspensions from separate wafers that have the same emission wavelength.

Figure 11A:
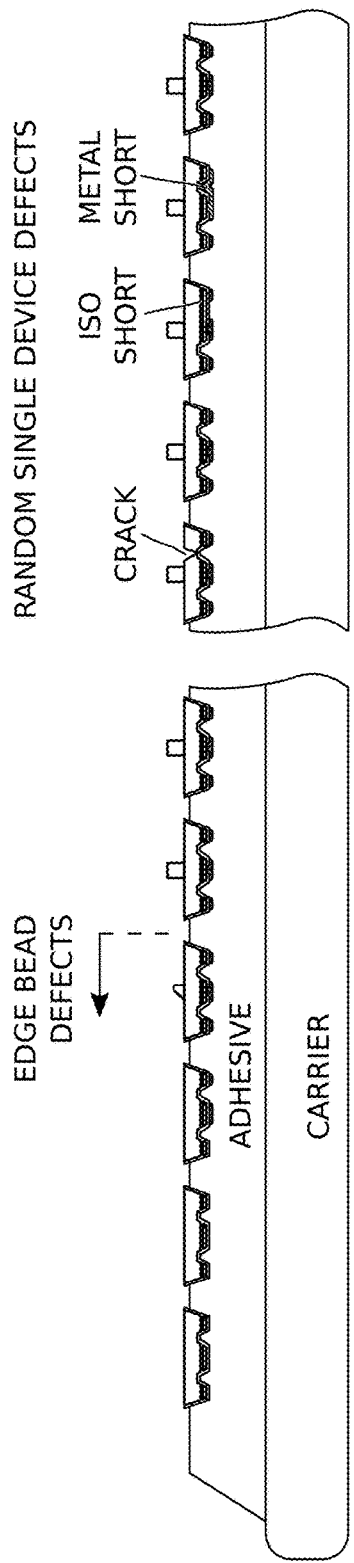
FIGS. 11A and 11B are partial cross-sectional views respectively depicting some representative microLED defects and corrective measures.
Figure 11B:
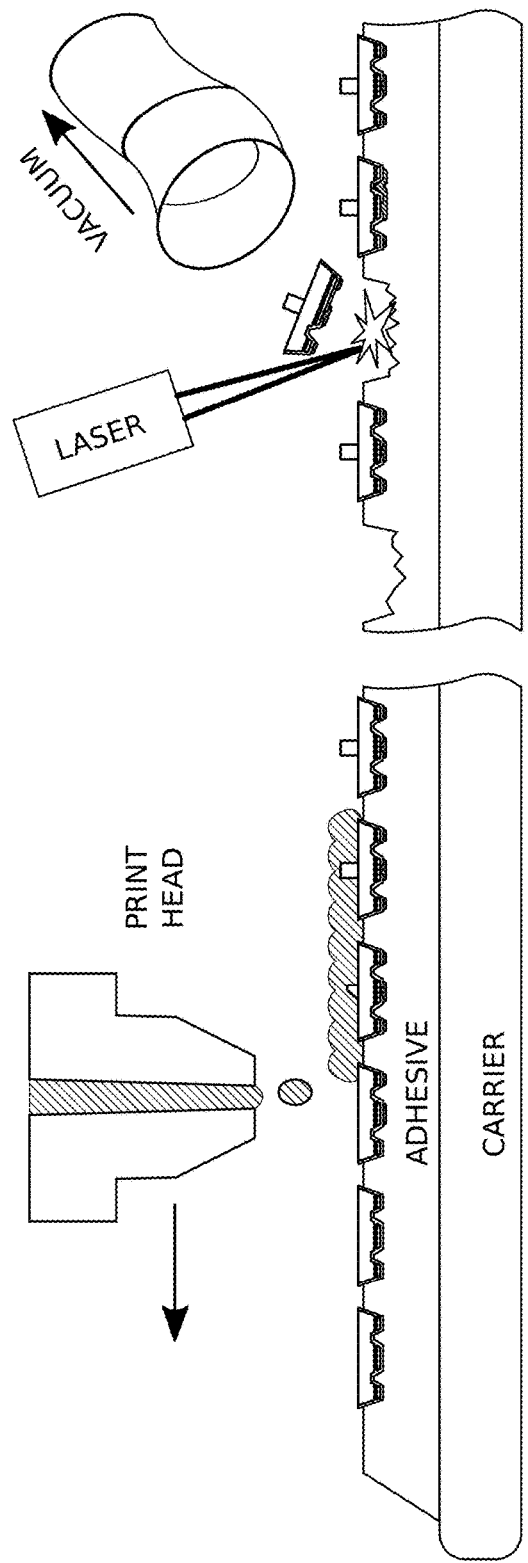

FIGS. 11A and 11B are partial cross-sectional views respectively depicting some representative microLED defects and corrective measures. Based on the size information in the composite defect map, the wafer is processed to eliminate defects in two ways as shown in FIG. 11B. Large defect areas, such as the edge bead and areas of missing pattern, are coated with a material that is resistant to the solvents used in the harvest process, so the defective regions remain captured on the carrier wafer after harvest. Suitable materials are SU8, epoxy resin, polyethylene terephthalate (PET), acrylonitrile butadiene styrene (ABS), or polyimide, which can be sprayed, patterned by inkjet, or even applied with a brush or stylus. The wafer may be baked after treatment to cure the holding material. The smaller defects identified as single devices are removed from the harvest wafer using a pulsed laser beam that is focused to a spot size smaller than the diameter of the microLED. The laser wavelength and energy are chosen so that absorption in the defective microLED causes rapid heating which ejects the target device from the adhesive layer. An auxiliary vacuum nozzle adjacent to the laser target zone is used to capture and dispose of the ejected devices to prevent redeposition on the carrier wafer.

Figure 12A:
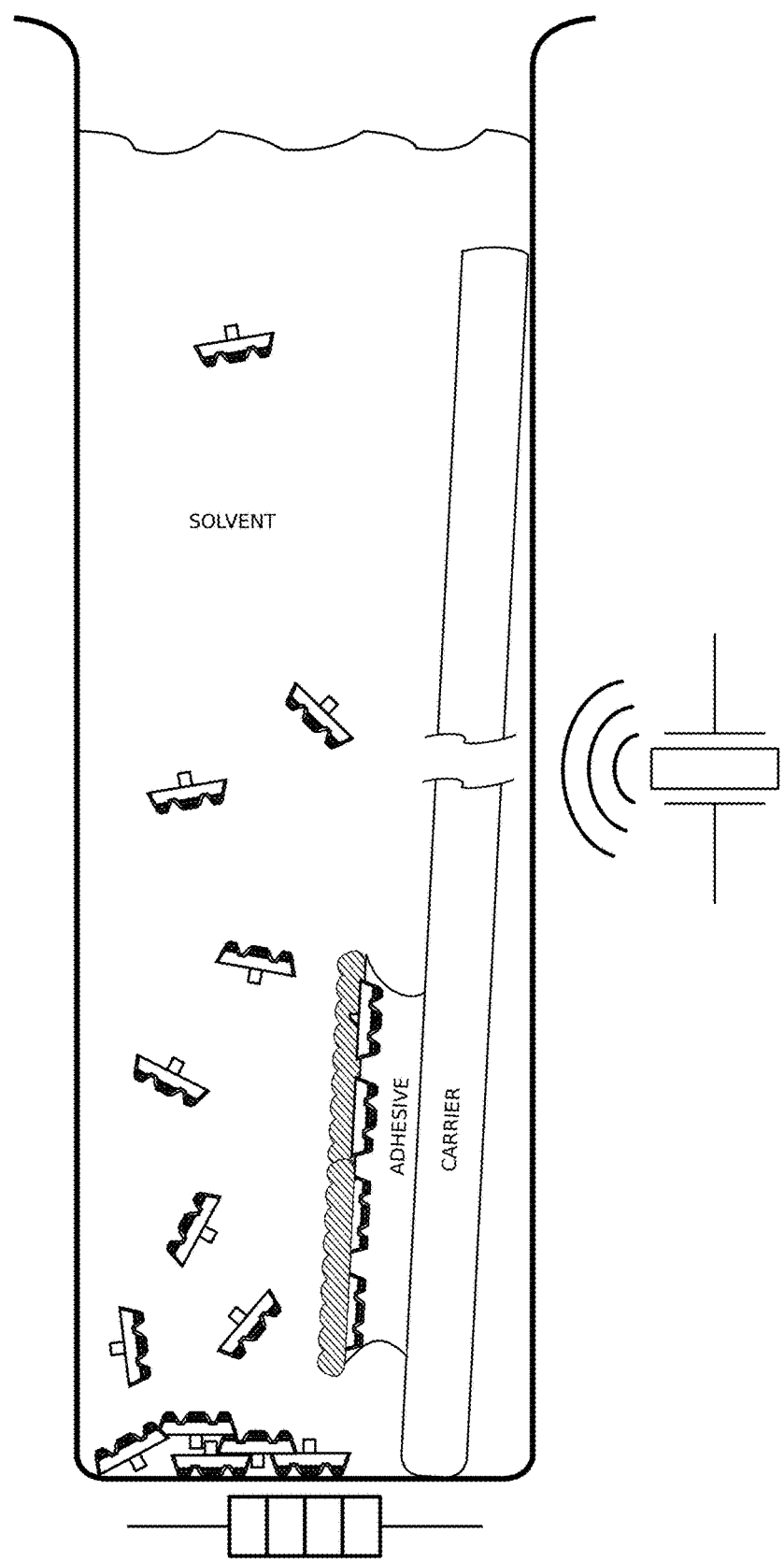
FIGS. 12A, 12B, and 12C are partial cross-sectional views of a microLED harvest in solvent.
Figure 12B:
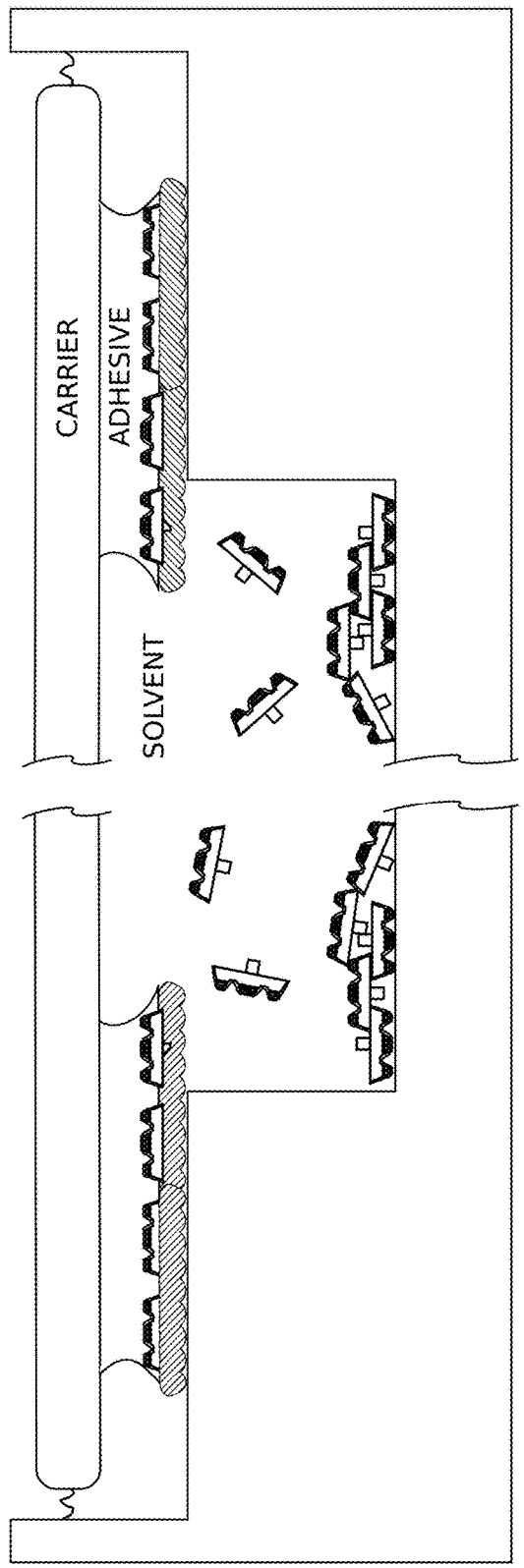
Figure 12C:
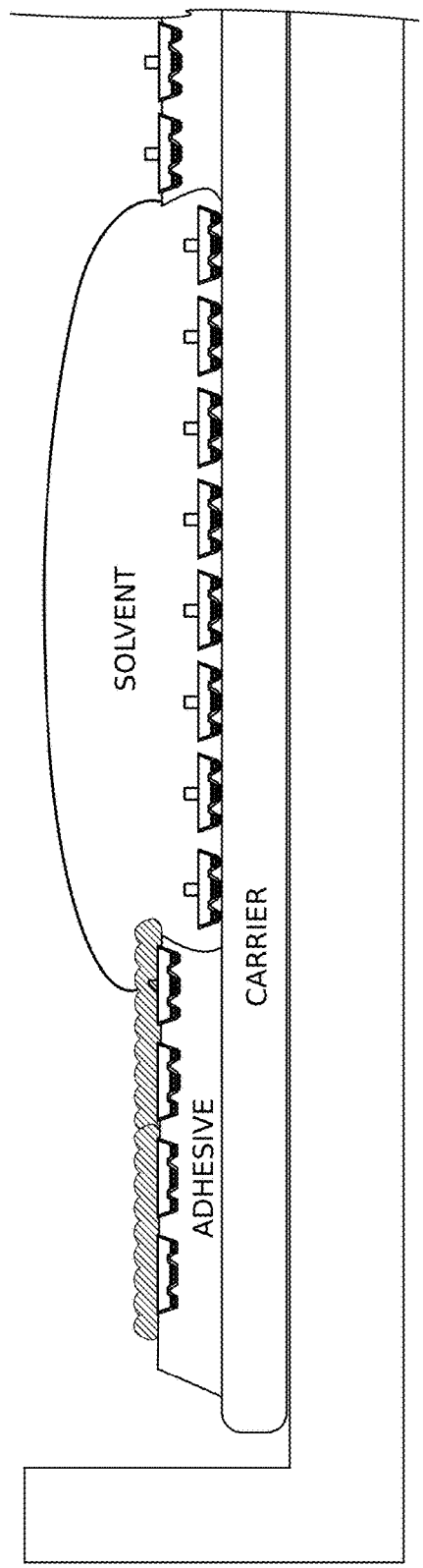

FIGS. 12A, 12B, and 12C are partial cross-sectional views of a microLED harvest in solvent. In FIG. 12A a carrier wafer with the known good microLEDs is placed in a solvent resistant container and immersed in a solvent or solvent mixture that dissolves the adhesive that is holding the microLEDs. The solvent bath may be acetone, toluene, trichloroethane, N-Methylpyrrolidone (NMP), xylene, cyclohexanone, butyl acetate, or the like, and the solvent may be heated and gently agitated to speed up the harvest process. Care is taken to prevent mechanical contact between the container and the microLEDs on the carrier, which can damage the devices. A container which supports the carrier wafer in a vertical position works well to allow solvent circulation, and permits microLEDs to settle to the bottom of the container as the adhesive dissolves.

An alternate harvest method (FIG. 12B) places the carrier wafer horizontally in a shallow container with the carrier supported by a narrow ledge that contacts the carrier only in the edge bead region as shown. It can be seen that the printed capture material protects the adhesive from solvent so the captured regions above a certain size remain on the carrier wafer. If the carrier substrate is not promptly removed from the solvent bath it is possible for large pieces of capture media to be released as the adhesive is undercut. When all of the microLEDs have been released and settled to the bottom of the container, the carrier wafer is removed, inspected for residual good microLEDs and discarded.

The "complete" wafer harvest methods described above are fast and simple but there are cases where selective harvest techniques can be used. MicroLEDs are harvested only in regions that are in contact with the adhesive dissolving solvent so a simple selective harvest can be carried out by placing a small droplet on the horizontal carrier wafer as shown in FIG. 12C. After the adhesive is dissolved, the harvested area is rinsed to remove the released microLEDs from the carrier wafer.

Another system for selective harvest of radial regions of a wafer uses the same principle of exposing a controlled region of the carrier wafer to the adhesive dissolving solvent, and is depicted in the system of FIG. 3A. Based on the wavelength contour map of FIG. 10 for example, the tilt and z height of the carrier substrate are adjusted so that only the region $\lambda_1$ (see FIG. 10) is submerged in the solvent bath. The carrier substrate is slowly rotated to equally expose the radial band to the solvent and the released microLEDs settle to the bottom of the solvent tank. When the first region has been harvested, the carrier is withdrawn from the solvent and the microLEDs with the $\lambda_1$ wavelength distribution are removed from the solvent bath. Then the carrier can be repositioned to harvest the $\lambda_2$ region and the process proceeds in the same way for successive harvest regions.

Typically, the harvest solvent is heavily contaminated with adhesive residue which also coats the microLEDs, so the microLED suspension is processed through a series of solvent exchanges to remove the contaminants. One solvent exchange cycle proceeds as follows:

1) The solvent is agitated indirectly by a vortex mixer or an ultrasonic transducer to thoroughly homogenize the suspension and breakup any remaining clumps of adhesive;
2) A wait of several times the settling time is incurred so all the microLEDs are collected at the bottom of the container;

3) 80 to 90% of the solvent is carefully decanted without disturbing the settled microLEDs;
4) Fresh solvent is added to the container; and,
5) Steps 1-4 are repeated.

Typically, three or more cycles of exchange are carried out to ensure that the adhesive components are removed. The solvent used for adhesive removal is chosen entirely based on the ability to dissolve adhesive without harming the electrodes of the microLED, so it not always an optimum choice for subsequent filtering and fluidic assembly operations. The same solvent exchange sequence may be carried out in Step 4 above, substituting a new solvent chosen to optimize cleaning or fluidic assembly. That exchange may also be performed at least three times to ensure that the harvest solvent has rinsed the microLEDs off the walls of the container. After fluid exchange, the microLED solution is transferred from the harvest container to a clean container that can be used to store and transport the suspension. The container should be chemically stable for the suspension solvent and hydrophobic to minimize microLEDs sticking to the surfaces. Some suitable materials are acetal homopolymer, polytetrafluoroethylene (PTFE), polypropylene, polystyrene, and the like.

Figure 13:
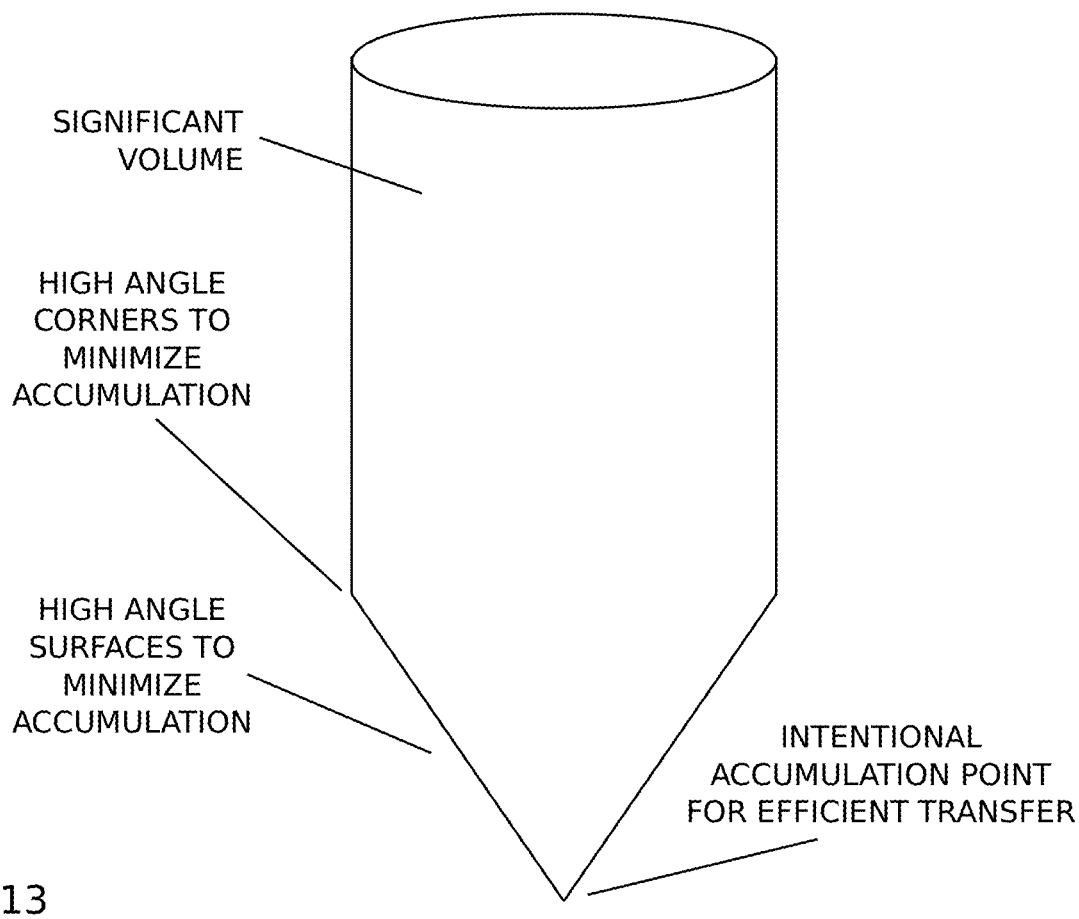
FIG. 13 is a partial cross-sectional view depicting an appropriate storage container.

FIG. 13 is a partial cross-sectional view depicting an appropriate storage container. Typically, the container is tall and slender with vertical walls and high angle surfaces to minimize accumulation except at a single intended location. This control of the accumulation point allows efficient transfer from the container. If the container is transparent it is convenient to use optical density measurements to monitor the uniformity of an agitated suspension and to tune the microLED concentration by adding or removing solvent.

Figure 14:
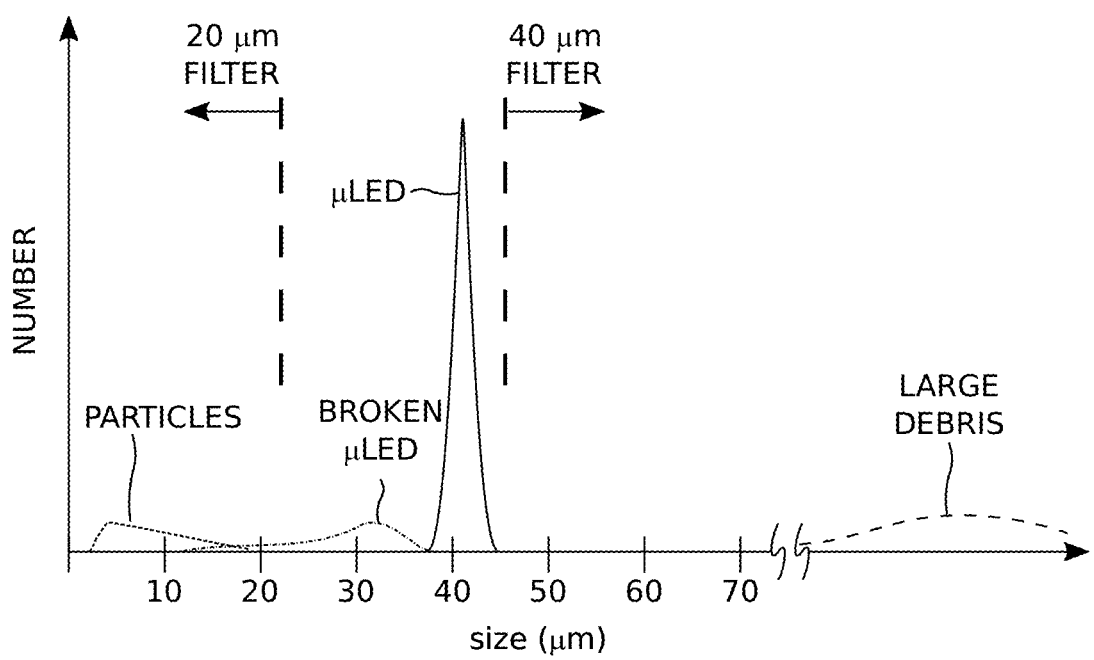
FIG. 14 is a graph showing the major diameter of exemplary microLEDs and contaminants.

FIG. 14 is a graph showing the major diameter of exemplary microLEDs and contaminants. The quality of the microLED suspension can be further improved by filtering to remove particles and debris. The exemplary microLEDs have a 42 micron (µm) diameter. The small particles below about 10 µm can be pieces of electrode metal from the electrode lift-off process, fragments of interlevel dielectric (ILD), or airborne dirt. These particles can be captured in the well structures during fluidic assembly, which causes yield loss by interfering with microLED assembly or bonding between the microLED electrode and the substrate electrode. The large debris can be fragments of GaN or smaller defects encapsulated in the capture medium that are released in harvest. The filtering process removes all the objects which are outside the size band centered on the diameter of the microLEDs.

It is clear from the figure that broken microLEDs of about the size of good microLEDs cannot be removed by filtering, so it is important that the selective harvest either captures or removes broken microLEDs before harvest. It is also important that suspension handling does not create new broken microLEDs by excessive mechanical interaction between microLEDs, or between microLEDs and the containers and fixtures used for transfer.

A simple filtering method uses mesh filters developed for cell harvesting to produce the desired bandpass around the microLED size. First the suspension is filtered through a 40 µm mesh to remove the large debris including any pieces of capture media that escaped the carrier wafer in harvest. Then the suspension is filtered using a 20 µm mesh to capture the microLEDs and to allow the small particles to pass through into a waste container. The microLEDs are back-flushed with clean solvent from the filter into a clean container.

Figure 15:
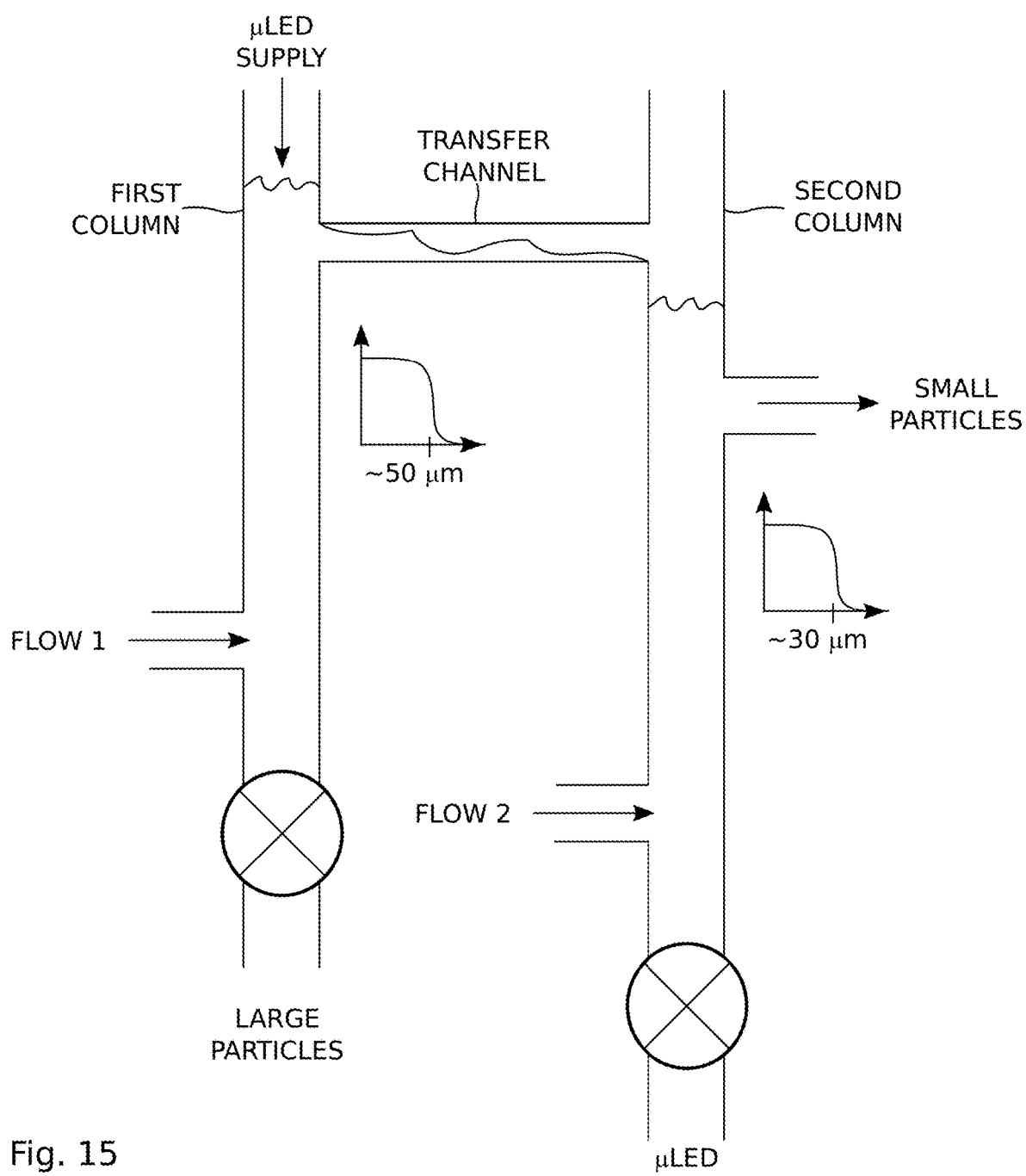
FIG. 15 is a schematic drawing of an elution cell.

FIG. 15 is a schematic drawing of an elution cell. The mesh filtering method is cheap and effective but there is significant mechanical interaction between the microLEDs and the filter, and in the fine filtering process the devices are subject to shear forces in the pile-up over the filter membrane. More sophisticated filtering methods based on fluid flow are useful to avoid the potential for mechanical damage. Since the hydrodynamic diameter of the microLEDs and the viscosity of the suspension solvent are known, it is possible to make an elution cell which acts as a filter as shown. The microLED suspension is introduced to the top of the first filter column (µLED supply) and solvent is supplied to the bottom of the column at a rate (Flow 1) that propels all of the particles smaller than a critical size of about 50 µm upward in the column, while larger particles settle to the bottom of the column where they can be collected and discarded. The small size fraction flows through a transfer channel to the top of the second elution column. In the second column Flow 2 is tuned so that particles smaller than about 30 µm are forced up and out the waste channel, while the microLEDs settle in the bottom of the column where they can be collected for assembly.

Figure 16:
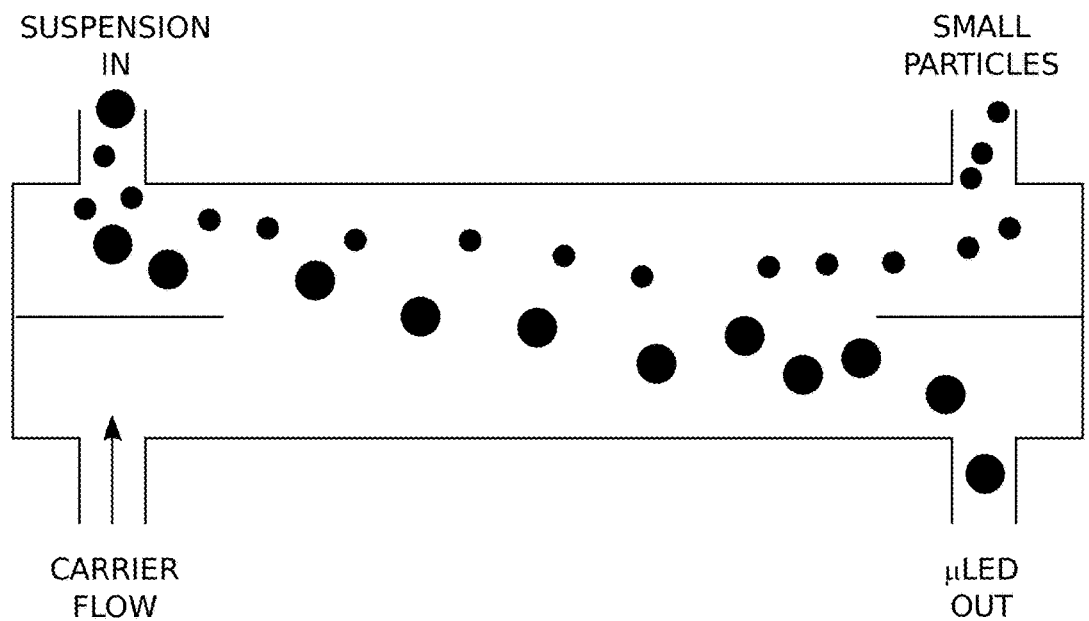
FIG. 16 is a schematic drawing of a continuous flow fractionation filtering method.

FIG. 16 is a schematic drawing of a continuous flow fractionation filtering method. The continuous flow fractionation method is similar to an elution cell, using the differences in settling rates of different particles to separate good microLEDs from the small particles. As shown, the carrier flow is tuned so that particles smaller than about 30 µm flow out the upper waste gate while the microLEDs, which fall more quickly, flow out the lower port.

Efficient fluidic assembly requires the uniform distribution of microLEDs across the display substrate and the number of microLEDs must be sufficient to fill all the available assembly sites (also referred to as trap sites or wells). In practice, the optimum number of microLEDs is larger than the number assembly sites. If the number of microLEDs is lower than an optimum value, assembly time increases because microLEDs must travel farther to reach an empty well site for assembly. However, if the number of microLEDs is higher than the optimum value, the devices tend to cluster together, interfering with the assembly process. In addition, all of the excess microLEDs must be removed after assembly, so if too many microLEDs are dispensed, the clean-off time increases and more microLEDs are included in the recycling process. Therefore, it is critical that the dispense process is based on a microLED suspension which has a known and well controlled number of microLEDs per unit volume.

Because variance in the number of microLEDs in an aliquot increases with suspension concentration and nonuniformity, the concentration of microLEDs in the suspension must be tuned to ensure that the correct number of microLEDs are transferred to the display substrate. The number of microLEDs harvested from the carrier wafer is well determined by calculating the harvested area with the defect areas removed. The concentration of the suspension can then be set simply by adding the appropriate volume of solvent in the final exchange step. However, changes in concentration are caused by solvent evaporation, removing aliquots for dispense, and returning recycled microLEDs to the suspension, among other things. In order to control concentration precisely a system for accurately determining the suspension concentration is necessary.

Returning to FIG. 2, for a radially symmetric transparent container, concentration varies only in z-axis, so to quantify microLED concentration at several heights in the suspension container, paired collimated LEDs (or laser diodes) and photodetectors can be used to shine light through the suspension and measure the density (optical opacity) which is represented as $\log(I_{in}/I_{out})$. The amount of light attenuation at various heights in the suspension is directly proportional to the concentration of microLEDs at those heights, so a calibration curve based on the size of the microLEDs is used to convert the optical density measurements to a calculated concentration. Optical density measurements are made beginning immediately after agitation produces a homogenized suspension, to determine the concentration. Measurements versus time and height in the container give the settling rate directly.

After approximately half the settling time, where detectors 210a and 210b receive full intensity, detector 210c returns to an intensity indicating 50-60% of the homogeneous microLED density, and detector 210n sees a microLED density close to that of the homogeneous state. When the suspension has been undisturbed for a long time, compared to the settling time, all of the microLEDs are collected in the bottom of the container, so light scattering is at a minimum and each of the intensity measurements is a maximum. If the suspension is well agitated, microLEDs are uniformly distributed throughout the liquid column and the light scattering at each height is at a minimum. After agitation stops microLEDs begin to fall under the influence of gravity until they reach the terminal velocity. With increasing time, the concentration of microLEDs at the top of the fluid column decreases and the detector intensity increases.

Figure 17A:
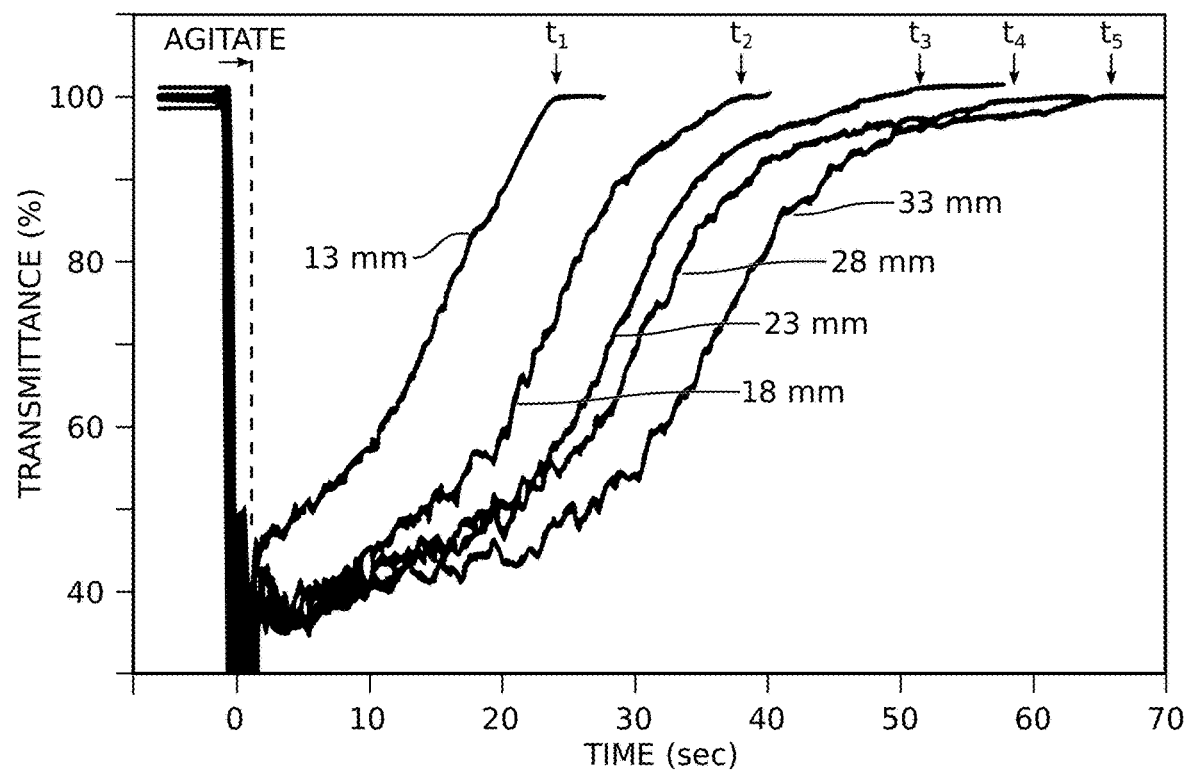
FIGS. 17A through 17C are, respectively, a graph depicting exemplary measurements of optical transmittance versus time for a suspension of 42 μm diameter microLEDs in 20 mL of isopropanol (IPA), a graph depicting exemplary measurements of optical transmittance versus time for 1.3 million microLEDs in different IPA volumes, and a calibration curve for microLED suspension concentration versus optical transmittance for this system.
Figure 17B:
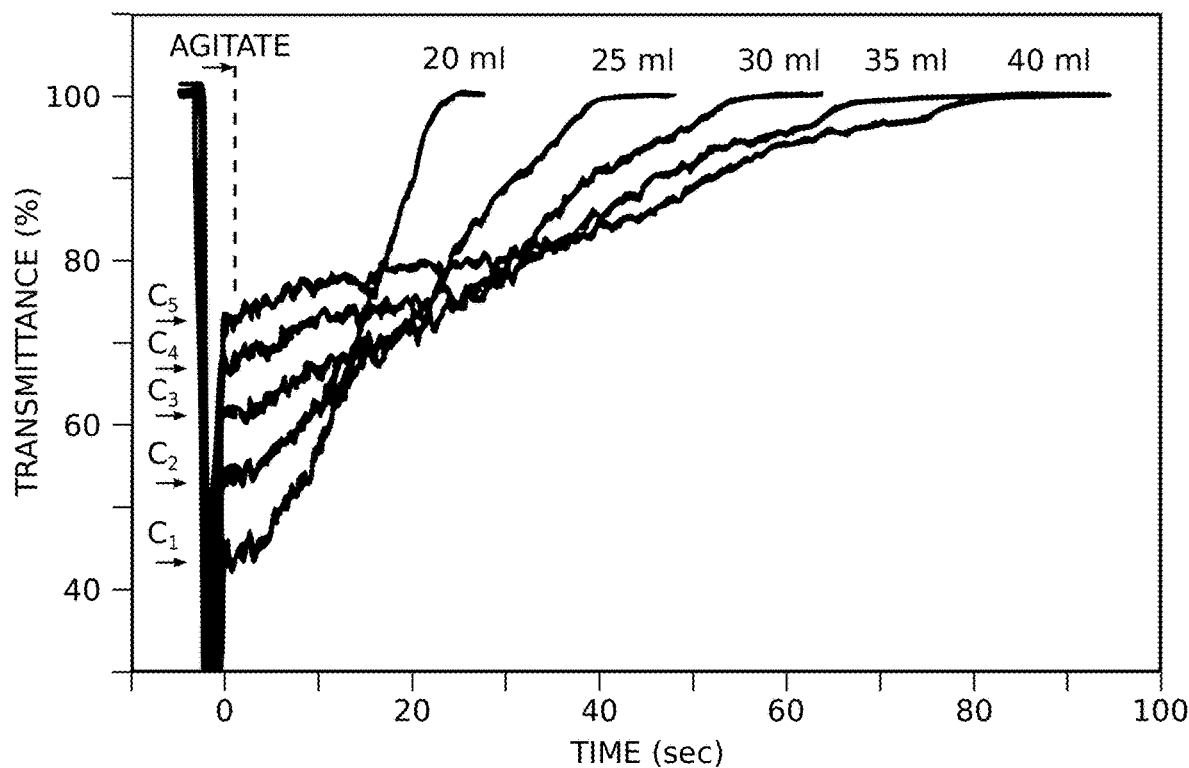
Figure 17C:
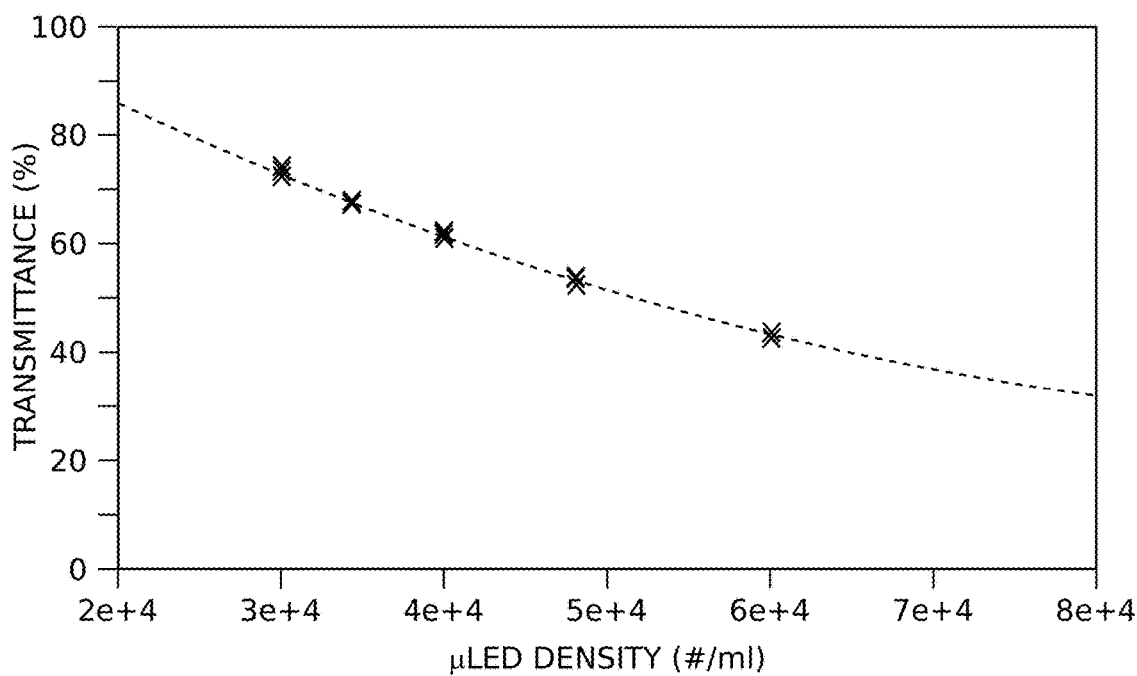

FIGS. 17A through 17C are, respectively, a graph depicting exemplary measurements of optical transmittance versus time for a suspension of 42 μm diameter microLEDs in 20 mL of isopropanol (IPA), a graph depicting exemplary measurements of optical transmittance versus time for 1.3 million microLEDs in different IPA volumes, and a calibration curve for microLED suspension concentration versus optical transmittance for this system. Optical opacity or density is defined herein as the inverse of transmittance, and the data is divided by the final intensity for the purpose of normalization. In FIG. 17A approximately 1.2 million microLEDs are suspended in a cylindrical translucent tube 27.5 millimeters (mm) in diameter and optical density is measured at five different vertical positions. At time zero the tube is mechanically vibrated to agitate the suspension producing a homogeneous distribution of microLEDs in the fluid column. During agitation, and for the first few seconds after agitation, there is significant noise due to air bubbles in the liquid. After agitation the measured light intensity is about 60% lower than for the settled suspension. The return to full intensity when all of the microLEDs have settled out of the sensing aperture is a function of the distance from the sensor to the top of the fluid column. So $t_1$ is 23 seconds for the upper sensor positioned 12 mm from the top of the liquid column, while the bottom sensor at 33 mm from the top of the column recovers in 64.5 seconds ($t_5$). Therefore, the terminal velocity for these microLEDs in IPA is 0.51-0.56 mm/second, so the settling time for a 45 mm liquid column is about 85 seconds, and settling after dispensing in a thin layer of liquid takes a few seconds.

The transmittance measurement system can also be used to determine the number density of microLEDs in a suspension, which is critical information for accurate suspension handling. In FIG. 17B transmittance is measured as a function of time after agitation for five different suspension dilutions. The 42 μm diameter microLEDs were characterized at the 13 mm position in 20 mL of IPA then measured amounts of liquid were added to make suspensions of lower density. In FIG. 17B the initial light intensity after agitation is lowest for the highest concentration ($C_1$) and increases with each successive decrease in density. Because the height of the liquid column increases, the settling time at a fixed position on the container increases as well.

FIG. 17C is a plot of multiple trials showing a calibration curve that determines the number of microLEDs per milliliter of liquid based on the optical transmittance of a homogeneous suspension. It can also be seen that the homogeneity of the suspension is high for several seconds after agitation and that regime duration decreases with decreasing distance to the top of the fluid column. It is desirable to draw an aliquot from this system a few seconds after agitation and more than 20 mm below the top surface. This characterization system can be used to select optimum process parameters for different microLED sizes, container size and shape, and suspension liquids.

Mixing of the microLED suspension is a balance between the force necessary to achieve high suspension uniformity and limiting shear force to prevent breakage. Mixing can be by external agitation where the smooth container walls deliver an impulse to the suspension, creating fluid flow within the suspension container that agitates the microLEDs. Internal agitation can be by introducing a stream of solvent or gas to the holding container to induce turbulent liquid flow. Mixing can also occur by rapid withdrawal and injection of liquid for example by pipette. The objective of course is to produce a uniform distribution of microLEDs over the vertical column of the container without damaging the devices.

From the well-mixed suspension, a controlled volume can be drawn out that contains the number of LEDs intended for one path of dispense. A dispense path can be a single point, a single line segment, a serpentine path, or some combination of paths. Multiple dispense paths are used to ensure complete and uniform dispense over the display assembly area. Because the settling time for LEDs is quite short, particularly in the thin layer of fluid used for assembly, the lateral spread from the dispense path is limited to the scale of millimeters. Therefore, a uniform distribution of microLEDs requires multiple dispense paths relatively close together.

Figure 18A:
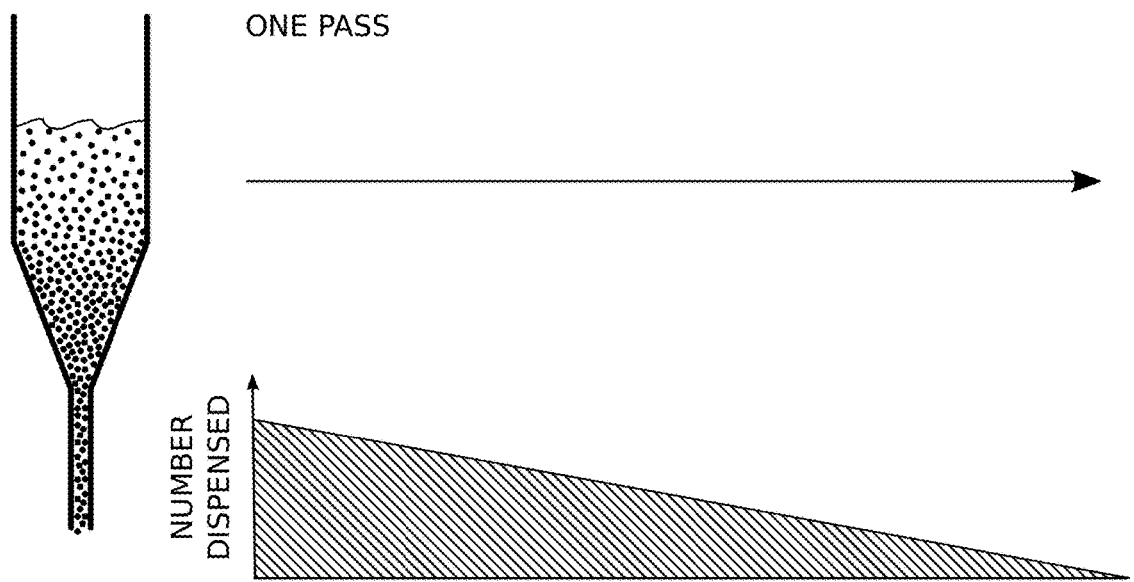
FIGS. 18A and 18B contrast dispense density gradients, respectively, for single and two pass/double speed dispensing paths.
Figure 18B:
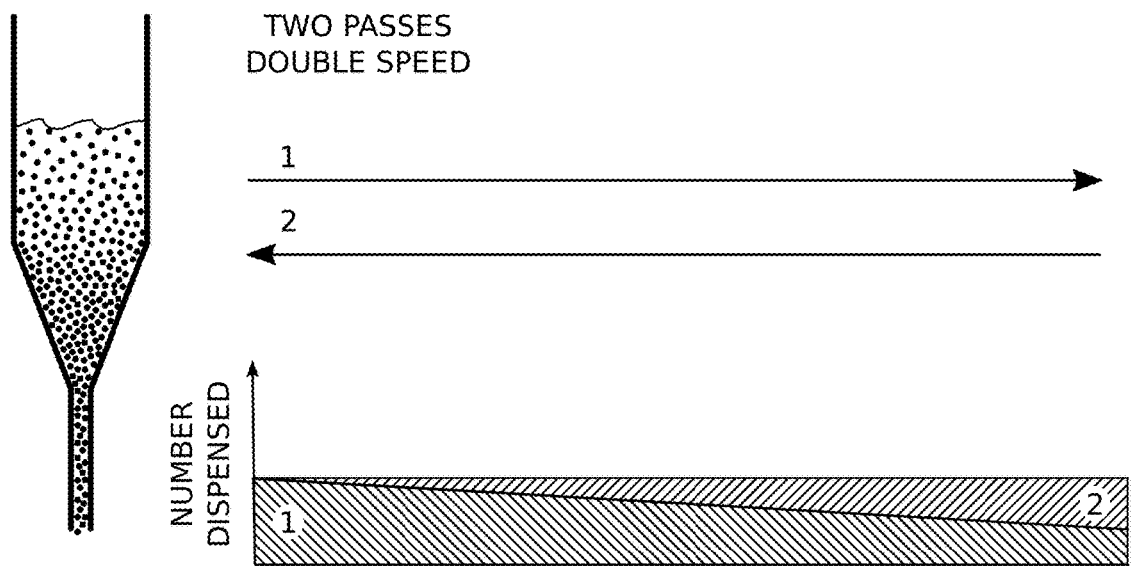

FIGS. 18A and 18B contrast dispense density gradients, respectively, for single and two pass/double speed dispensing paths. The precise method by which the dispense volume is transferred from the well-mixed suspension is determined based on the characteristics of the system and product requirements: in particular, the assembly substrate dimensions, the dispense head travel speed, the assembly fluid thickness above the substrate, the mixing uniformity, and the control over transferred volumes are all important. These considerations are generally a tradeoff between uniformity and cost including system expense, process time, and product yield. Deficiencies in dispense uniformity may also be compensated for in the assembly process, so a range of approaches is presented. For example, a given path can rapidly retrace a single line segment multiple times to compensate for the nonuniform dispense rate, such as might be caused by settling within the dispense head, and achieve a uniform density along the path as shown in FIG. 18B.

Figure 19A:
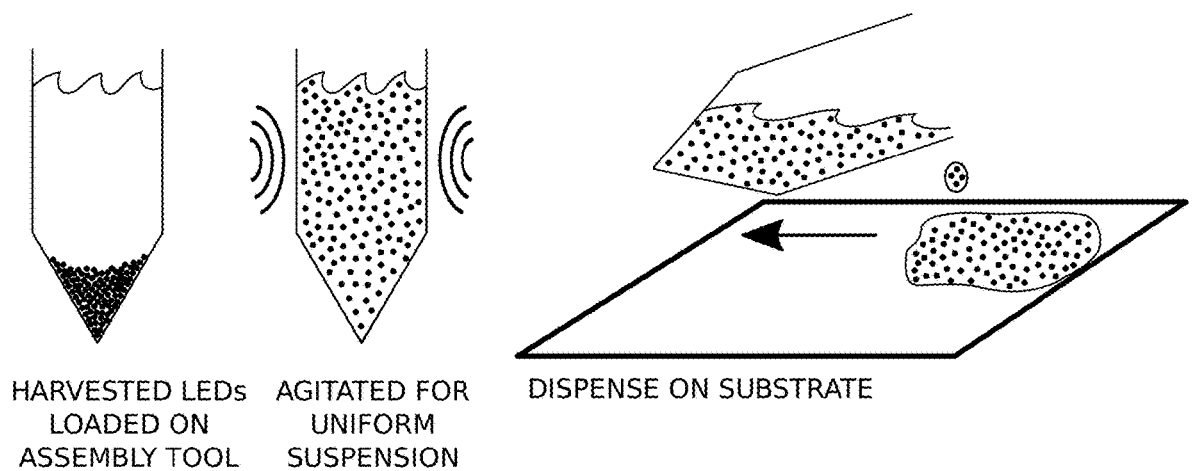
FIGS. 19A through 19C are schematics respectively depicting the direct transfer of a well-mixed suspension from the initial source container to the assembly substrate via decanting from container, nozzle, and tubing.
Figure 19B:
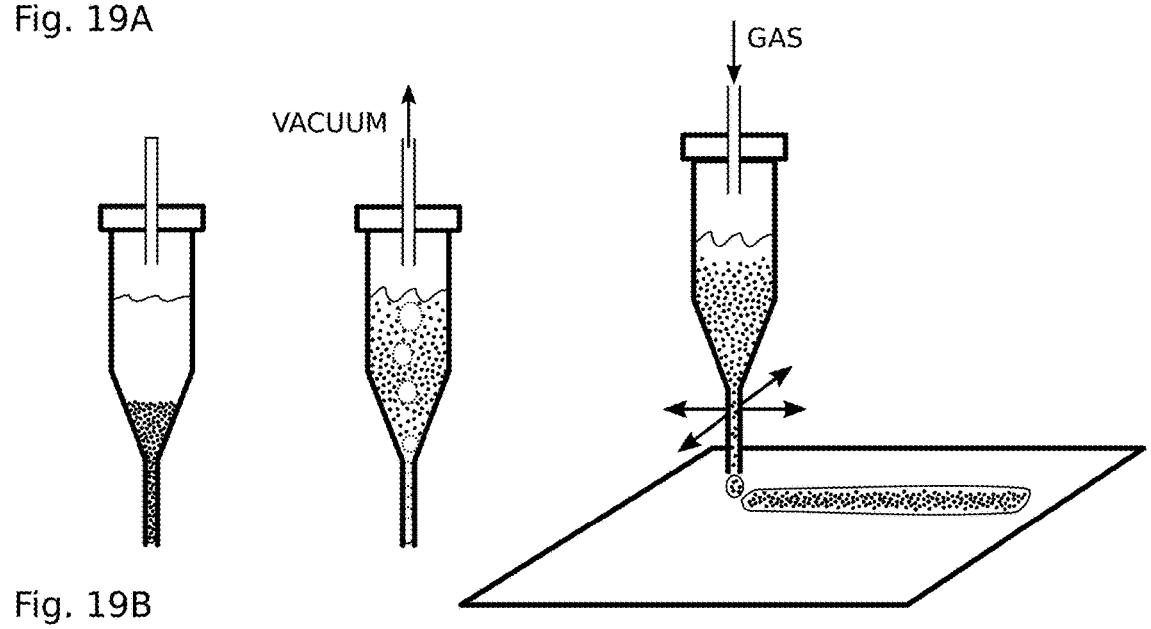
Figure 19C:
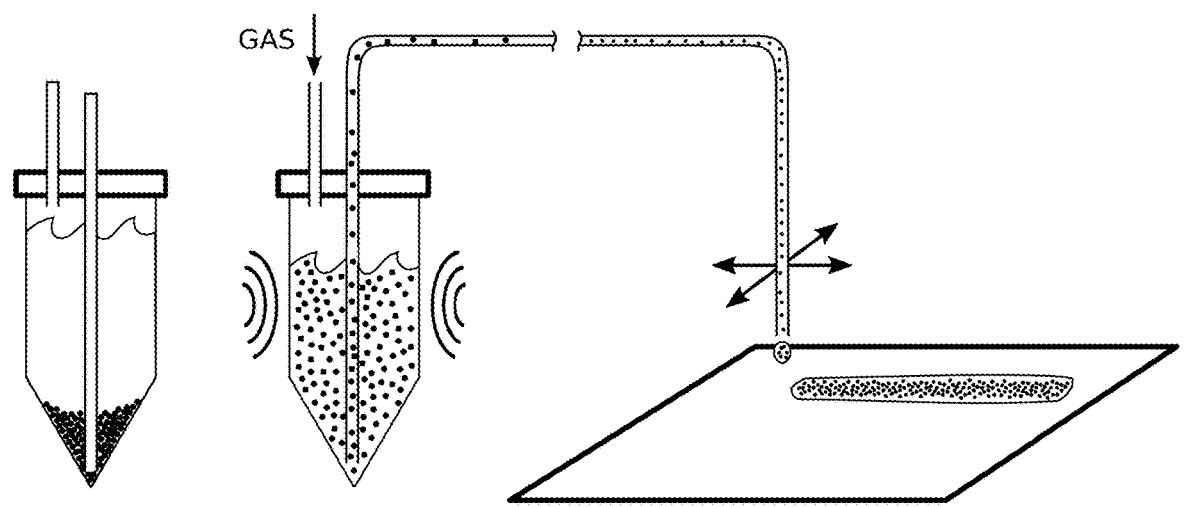
Figure 20:
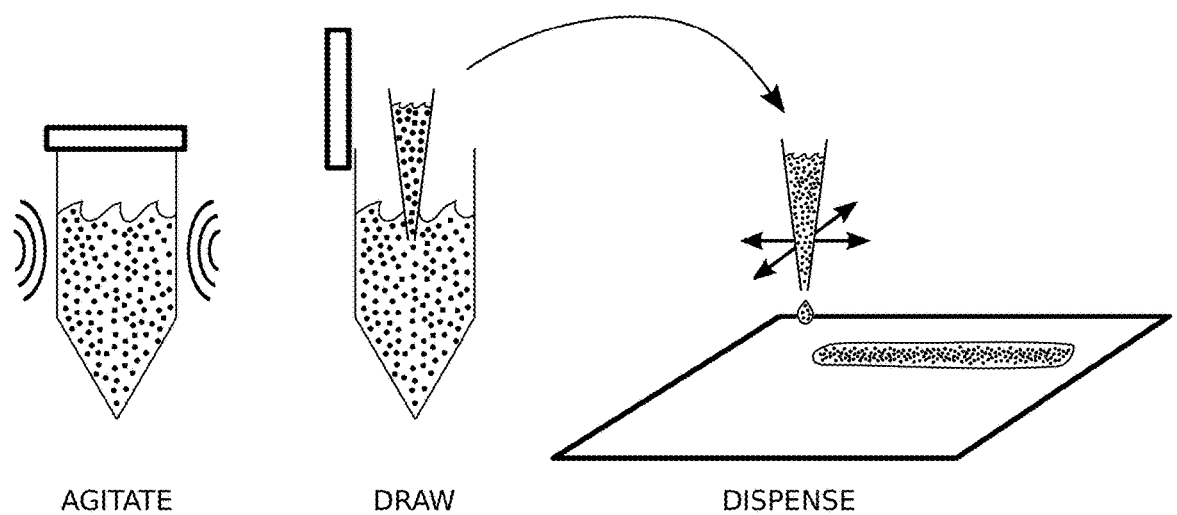
FIG. 20 is a schematic showing controlled volume pipetting from a well-mixed suspension to the assembly substrate.
Figure 21:
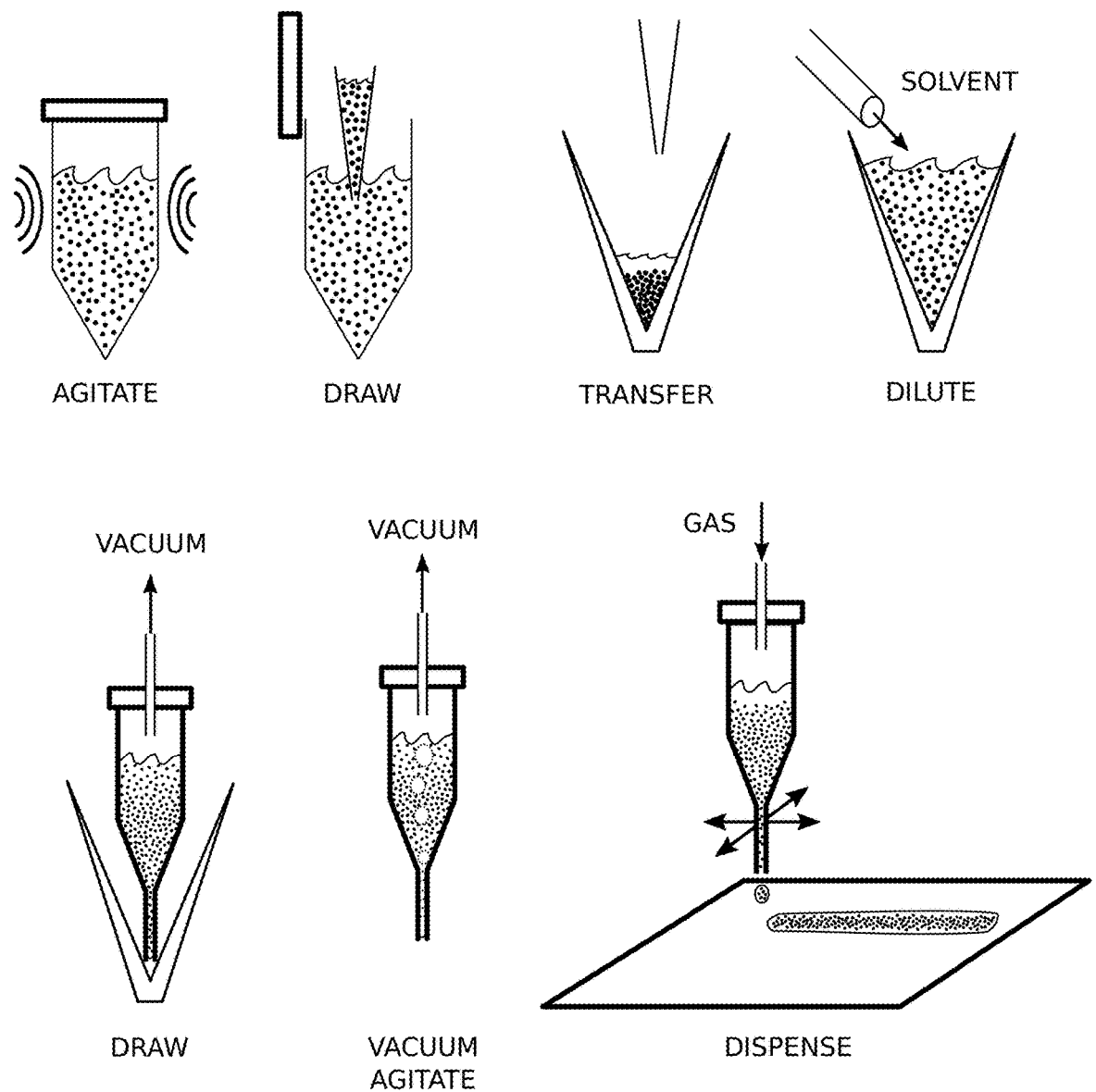
FIG. 21 is a schematic showing amended suspension in an intermediate pot, and subsequent aspiration and dispense via a bubble mixed dispense head.
Figure 22:
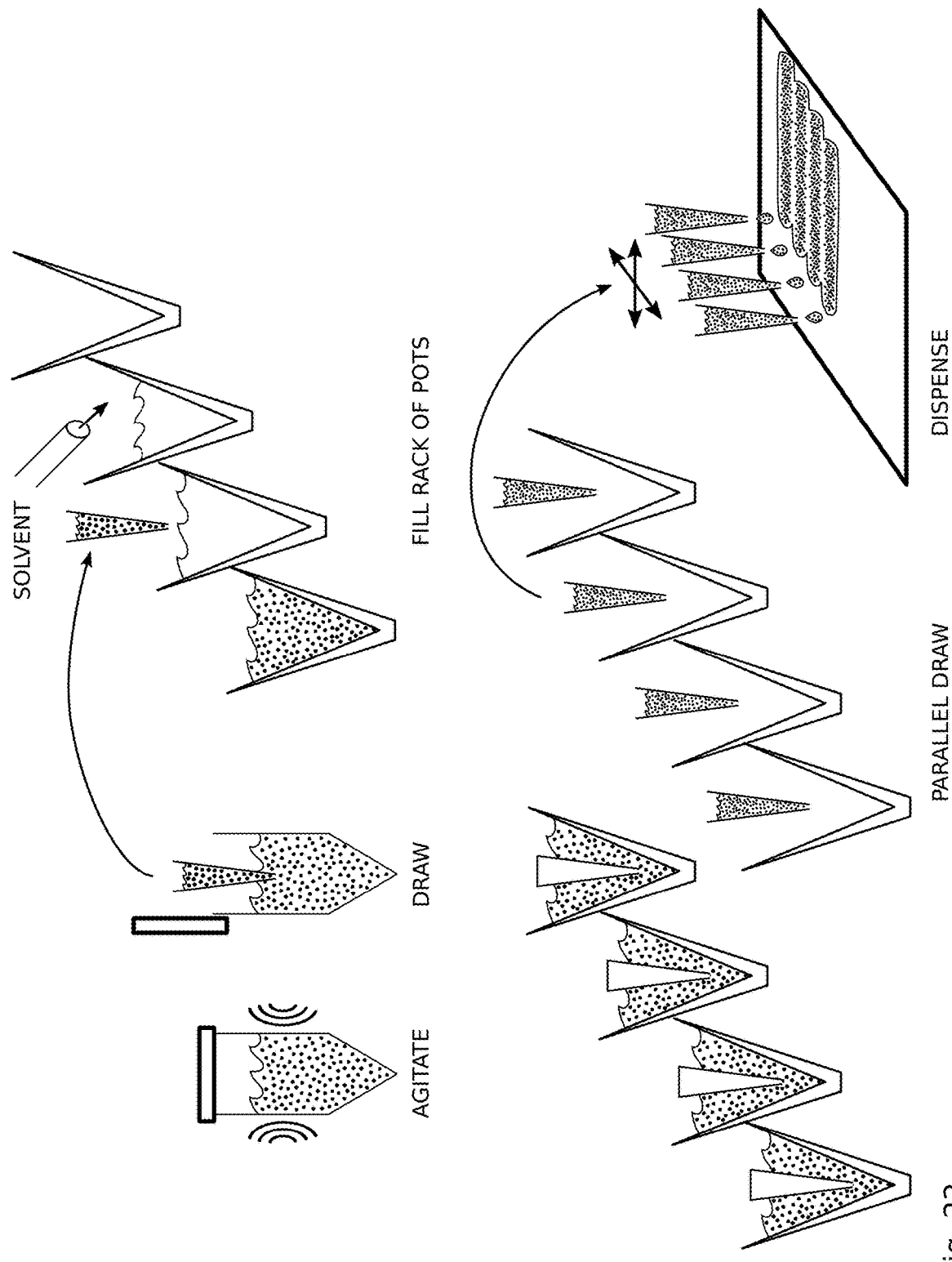
FIG. 22 is a schematic of a parallel dispense method using an array of dispense heads.

FIGS. 19A through 19C are schematics respectively depicting the direct transfer of a well-mixed suspension from the initial source container to the assembly substrate via decanting from container, nozzle, and tubing. A transfer of the well-mixed suspension that limits or completely avoids the usage of tubing and fittings, may use either direct transfer from the source tank or taking discrete aliquots of the source suspension as by a pipette tip. This approach avoids microLED-accumulating dead zones in fittings and limits interaction with the suspension to surfaces that are: a) small, b) cleanable, and c) potentially disposable. The pipette tip may draw the suspension from the tank either by volumetric displacement (as by a plunger) or by actively applied vacuum. The advantage of applying continuous vacuum is that once the aliquoted suspension is no longer in contact with the source suspension, ambient atmosphere is drawn through the aliquot as bubbles that actively mix the suspension during transfer.

To limit yield loss, high concentration suspensions are preferred until just prior to introduction to the substrate. At this point, the above aliquoting approach can be coupled with an intermediate, small-volume container where the dispense suspension is supplemented with additional liquid. This can be done by filling the ink pot with a known volume of neat liquid through standard systems including tubing, valves, and fittings, because the neat liquid is not subject to the restrictions of the microLED suspension. The suspension aliquot can be amended by aspiration of the liquid into the dispense head or by depositing the suspension into the ink pot, and then withdrawing the mixture into the dispense head. The diluted suspension may then be transferred to the substrate.

The above processes for mixing, transfer, and potential dilution are general and their incarnations may be selected to compose a unified system and method of application that is optimized for the type of microLED display that is being produced. Several full dispense processes are detailed below as examples.

In FIG. 19A, the desired number of LEDs may be dispensed directly from the well-mixed container to the assembly substrate. This approach has the fewest transfer steps and potentially the fewest surfaces exposed to undesirable microLED stiction. As the fully settled state of the suspension is nonuniform, the system mixes the suspension to a uniform suspension density so that volumetric suspension transfer corresponds to microLED number transfer. The well-mixed suspension may then be directly transferred to the substrate. Decanting the microLEDs onto the substrate creates a significant flow throughout the fluid on the substrate, and this flow can quickly transfer LEDs to the full extent of large areas. However, uniformity may be poor, requiring additional assembly time to compensate.

In FIG. 19B a small area nozzle, paired with appropriate pressure control in the head space of the container, can transfer suspension in a more controlled manner, although this method is significantly slower than decanting. This approach also requires translation of the microLED container over the assembly substrate with more precision than with the decanting method.

In FIG. 19C, rather than translate the container, a tube can be used with one end submerged in the suspension and the output end translated over the assembly substrate. The advantage of this approach is that the suspension container may be actively mixed during dispense, and translating the tube end is significantly easier than translating the container. Multiple tubes can originate from one container of microLED suspension, significantly increasing the dispense coverage area in a single pass. The drawback to this method is the extremely high surface area that the suspension interacts with, and the resulting capture of microLEDs in the tubing. In applications where cross-contamination is not a concern, this approach with limited tubing is optimal.

FIG. 20 is a schematic showing controlled volume pipetting from a well-mixed suspension to the assembly substrate. Rather than dispensing directly from the container, a pipettor can draw an aliquot from the well-mixed suspension to dispense directly to the substrate as schematically shown. This approach leverages established techniques in biological sciences to reliably transfer aliquots with high precision. Additionally, this approach does not require any additional configurations for the suspension container such as pour spouts, nozzles, etc.

The pipette transfer approach is best used when precise volumes and the prevention of cross-contamination are the highest priority, such as when minimizing excess microLEDs used in assembly, or when sequentially assembling distinct size-exclusive microLEDs. The tradeoff is that pipette dispense is slower than other methods because the pipettor needs to return to the suspension container after each dispense path. Multi-head pipettors exist but they are not well-suited to draw from a single source, considering the concentration and mixing constraints of the suspension container.

FIG. 21 is a schematic showing amended suspension in an intermediate pot, and subsequent aspiration and dispense via a bubble mixed dispense head. An additional restriction for direct transfer and pipettor transfer methods is that the dispensed volume is equal to the volume taken from the initial suspension container. To limit the size of the suspension reservoir for large dispense areas it can be desirable to reduce the concentration of the suspension dispensed on the assembly substrate. One way to achieve this dilution is to draw a concentrated aliquot from the suspension supply reservoir and amend it with neat liquid either in the dispense head, or in an intermediate pot as shown.

FIG. 22 is a schematic of a parallel dispense method using an array of dispense heads. The use of an intermediate pot has a potential advantage of separating the dispense head pickup from the suspension container pickup. Thus, the system can be scaled up as an array of dispense heads pulling from an array of ink pots as shown. The generation of racks of ink pots with a precisely controlled microLED concentration can be done in a separate process, with the racks then loaded into the assembly tool with the assembly substrates.

The three approaches described are all variations on the central concept of efficient transfer of microLEDs. Fluidic assembly can be used for a wide variety of microLED sizes, assembly areas, and pixel pitches. Some examples of how variations in assembly requirements may influence the selection of approaches are included below:

For monochrome assembly of small area substrates, direct dispense may be desirable.

The batch assembly of multiple substrates in parallel from a single suspension container suggests the use of a decanting approach.

The serial assembly of substrates is probably best suited to a nozzle approach.

Large area assembly of large volumes with well-suspended microLEDs having low batch-to-batch wavelength variation may be most economical with a tube-mediated transfer from the suspension source container.

For intermediate scale substrates (a few centimeters on a side) with valuable microLEDs and low cross-contamination tolerance—such as sequentially assembled 3-emitter RGB displays, pipetting dispense may be preferred. This is especially true in situations where dispense time for the pipettor is not a significant fraction of the process time.

For very large substrates over Gen 2 size (360×465 mm), single head dispense becomes prohibitively slow and throughput requirements dictate a dispensing system where an array of multiple heads dispense in parallel. For quick-settling suspensions, the ability to vacuum mix the suspension is important to improving dispense uniformity. Additionally, for large substrates, the total dispense volume requirement becomes very high, and amending the concentrated source suspension improves handling and mixing uniformity.

Some key requirements for dispensing microLEDs from suspension to a substrate are limiting microLED waste from breakage, surface adhesion, and application nonuniformity. As such, the suspension optimally encounters no valves, pumps, or fittings throughout the harvest, filter, mix, dispense, and recycle operations. Unavoidably, there is some loss to the suspension container itself, however thorough rinsing, combined with capture and recycling processes, greatly mitigates that loss. For the pipette transfer approach, only the pipette tip makes contact with the suspension. The pipette can be flushed inside-and-out to recover microLEDs and can be disposed of to prevent microLED cross-contamination.

The vacuum-mixed dispense heads, which use disposable tips, as well as the intermediate ink pots may be flushed for recovery, reused if cross-contamination is not a concern, or replaced to prevent cross-contamination. The embodiment described in FIG. 19C uses tubing that is unlikely to be cleanable and is presented only as an option where cross-contamination is not a concern and the microLEDs are very well suspended, minimizing contact with tubing sidewalls.

Figure 23:
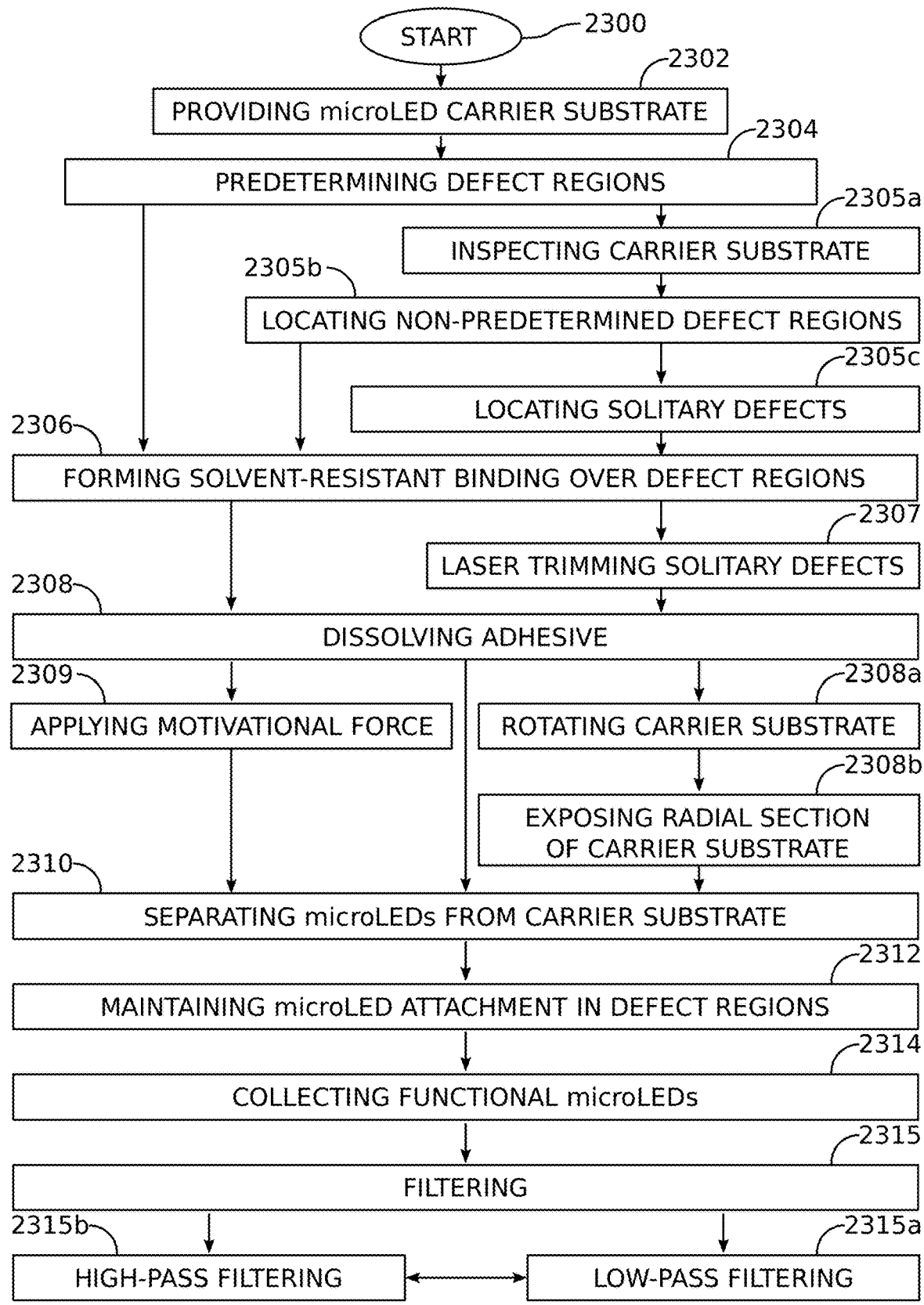
FIG. 23 is a flowchart illustrating a method for the selective harvest of microLED devices from a carrier substrate.

FIG. 23 is a flowchart illustrating a method for the selective harvest of microLED devices from a carrier substrate. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 2300.

Step 2302 provides inorganic microLED devices attached to a carrier substrate with an adhesive. In Step 2304 defect regions are predetermined, where each defect region includes a plurality of adjacent defective microLED devices or process control structures (e.g., a CMP scratch). Step 2306 forms a solvent-resistant binding material overlying the predetermined defect regions. Step 2308 dissolves exposed adhesive with an adhesive dissolving solvent. Some examples of adhesive dissolving solvent include of acetone, toluene, trichloroethane, N-methylpyrrolidone (NMP), xylene, cyclohexanone, butyl acetate, or combinations thereof. Step 2310 separates microLED devices located outside the predetermined defect regions from the carrier substrate. Step 2312 maintains the adhesive attachment of microLED devices inside the predetermined defect regions to the carrier substrate. In response to separating the microLED devices from the carrier substrate, Step 2314 collects functional microLED devices in a harvesting container.

In one aspect, Step 2305a inspects the carrier substrate to locate defective microLED devices, and Step 2305b locates non-predetermined defect regions including a plurality of adjacent defective microLED devices. The inspection process may be performed by optical comparison, electroluminescence, photoluminescence, or cathodoluminesence testing. Then Step 2306 forms the solvent-resistant binding material overlying the non-predetermined defect regions. In another aspect, Step 2305c locates non-predetermined solitary defective microLED devices in response to the inspection of Step 2305a. Then, Step 2307 uses a laser trimming process to eject the solitary defective microLED devices.

In one aspect, Step 2309 applies an additional motivational force such as fluid circulation, thermal energy, gravity, vibration, or combinations thereof, and Step 2310 separates the microLED devices from the carrier substrate at least partially in response to the additional motivational force.

In one aspect, dissolving exposed adhesive in Step 2308 includes selectively exposing sections of the carrier substrate to the adhesive dissolving solvent. Then, separating microLED devices from the carrier substrate in Step 2310 includes separating microLED devices from the selectively exposed sections of the carrier substrate. More explicitly, selectively exposing sections of the carrier substrate to the solvent may include the following substeps. Step 2308a rotates the carrier substrate in a solvent bath. Step 2308b exposes a radial section of the carrier substrate having a radius greater than d to the bath solvent. Then, separating microLED devices from exposed sections of the carrier substrate in Step 2310 includes separating microLED devices from the radial section of the carrier substrate.

In another aspect, collecting functional microLED devices in the harvesting container in Step 2314 includes replacing the adhesive dissolving solvent with a fluid. If the functional microLED devices collected in the harvesting container in Step 2314 have an average cross-sectional physical dimension s, and there are impurities in the fluid, Step 2315a filters to remove impurities having a maximum cross-sectional physical dimension greater than t, where t>s. Alternatively, or in addition, Step 2315b filters to remove impurities having a maximum cross-sectional physical dimension less than p, where p<s. The filtering methods of Step 2315a and 2315b may use a mechanical mesh, elution, fractionation, or combinations thereof. For example, to perform both high-pass and low-pass filtering, mechanical filtering may use two different mesh sizes. For elution and fractionation the flow rates need to change, and the two output ports are switched between product and waste. Further, there is no reason to use the same process for both types of filtering. For example, a mesh filter can be used to remove the large contaminants followed by a fractionation cell to remove the small particles.

In one aspect, replacing the adhesive dissolving solvent with the fluid in Step 2314 includes exchanging the adhesive dissolving solvent with a filtering solution having a lower viscosity than the adhesive dissolving solvent, and the method filters in Step 2315, to remove impurities from the filtering solution.

In another aspect, Step 2314 replaces the adhesive dissolving solvent with an assembly solution that may have a lower polarity than the adhesive dissolving solvent or a higher evaporation rate than the adhesive dissolving solvent. Surfactants can also be added, such as anionic, cationic, non-ionic surfactants, or combinations thereof.

Figure 24A:
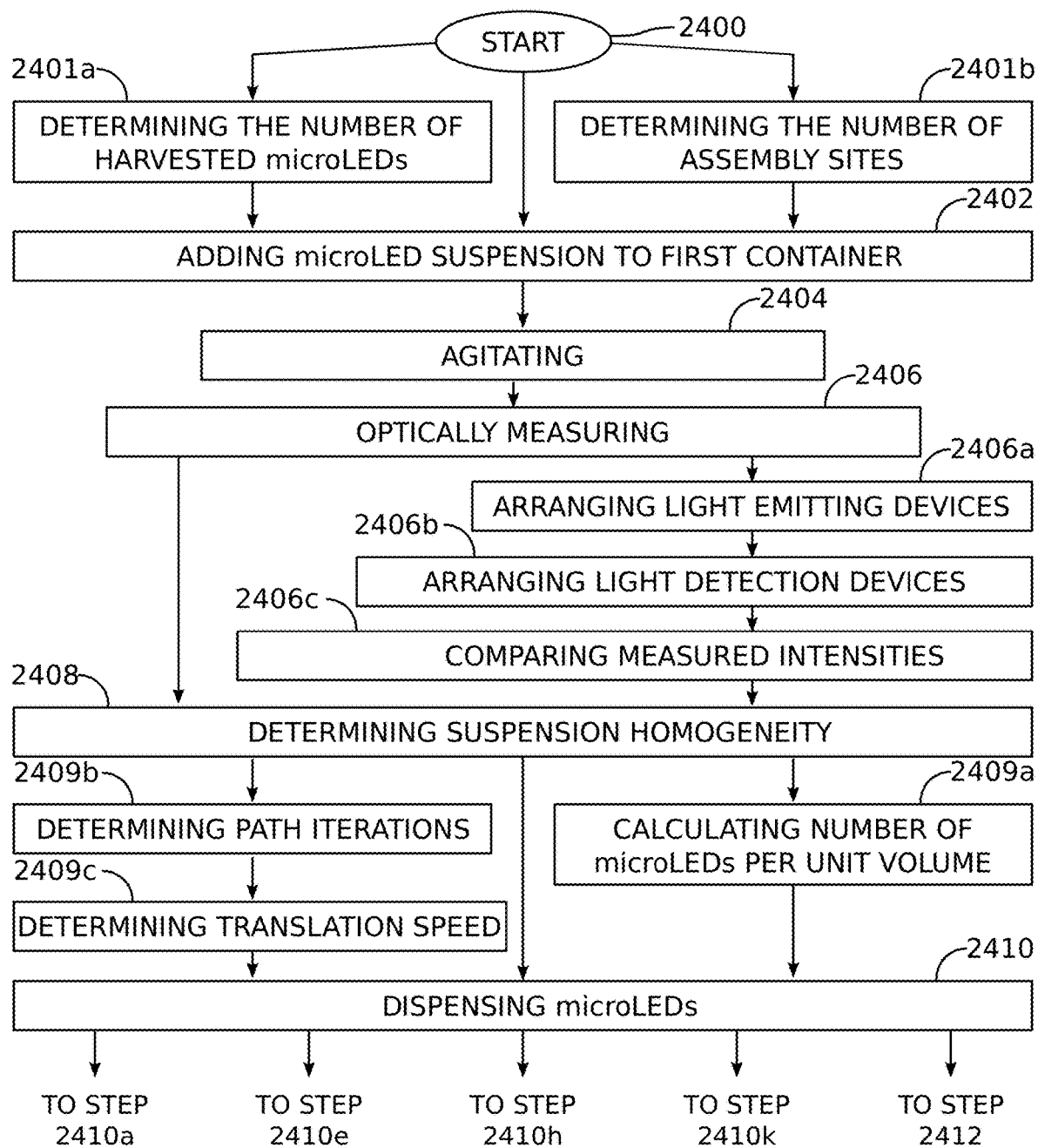
FIGS. 24A through 24C are flowcharts illustrating a first method for the dispersal of microLED devices on an emissive display panel.
Figure 24B:
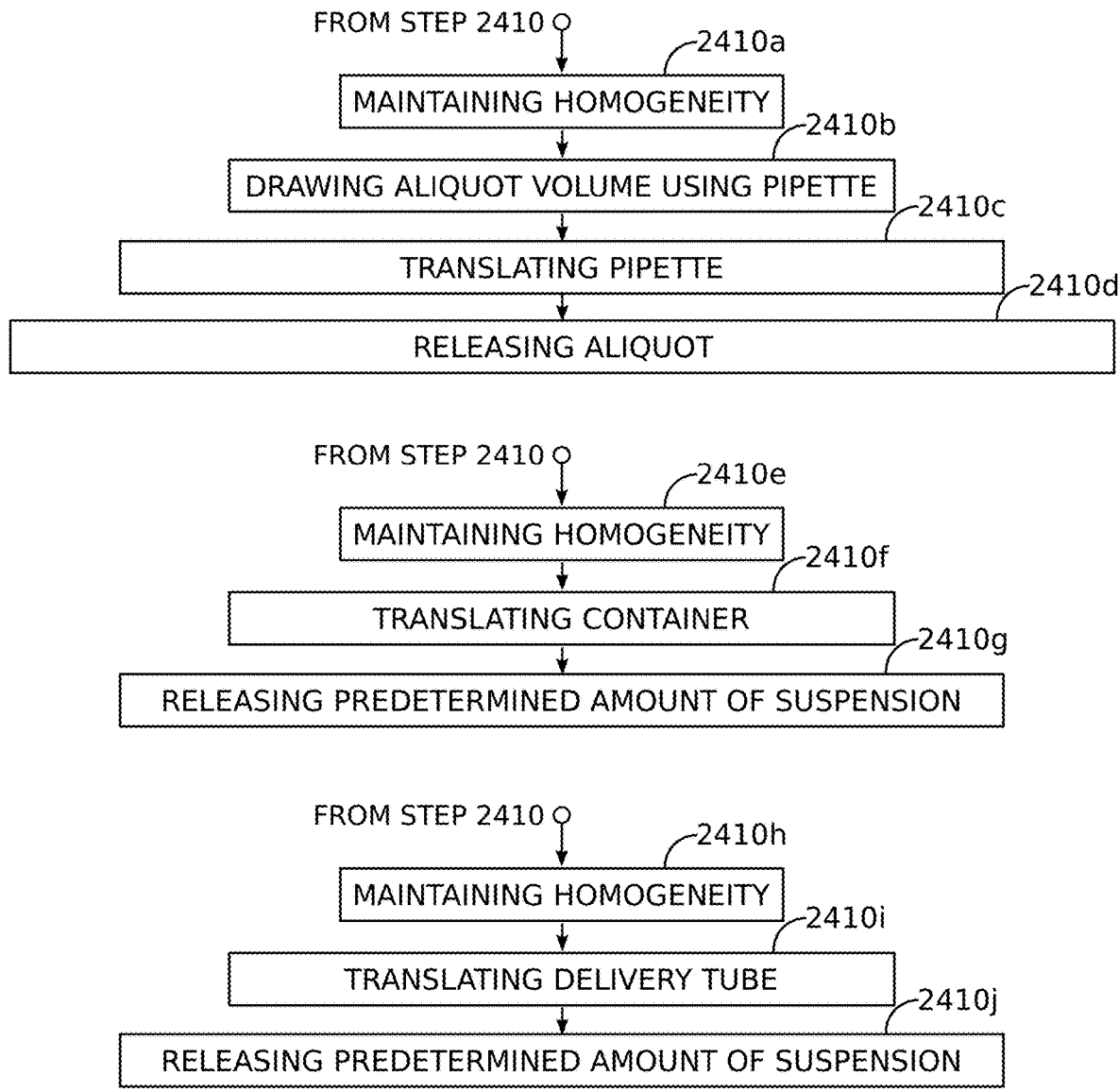
Figure 24C:
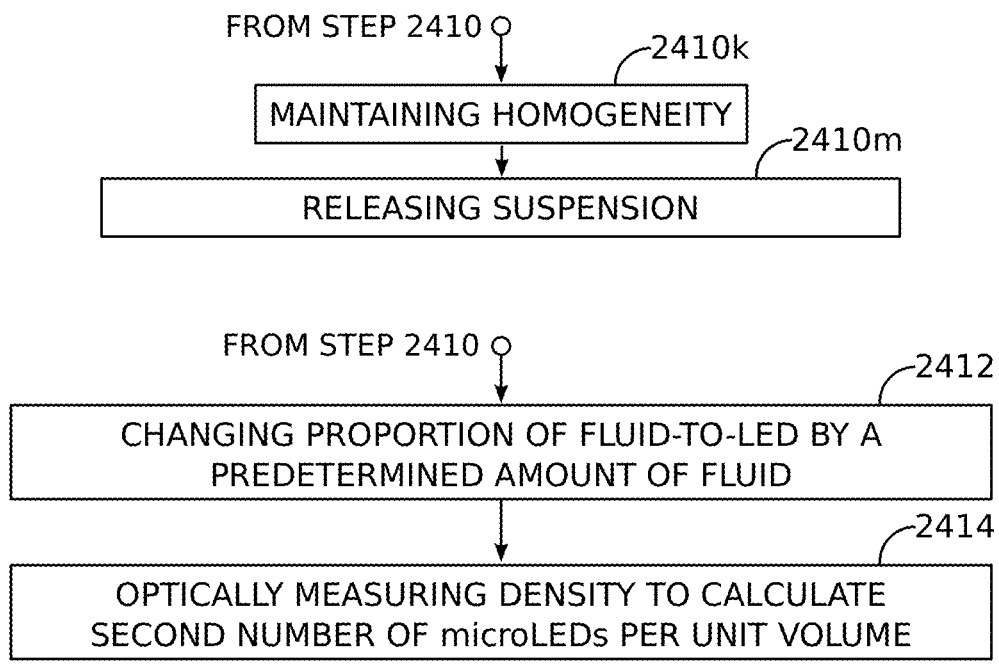

FIGS. 24A through 24C are flowcharts illustrating a first method for the dispersal of microLED devices on an emissive display panel. The method begins at Step 2400. Step 2402 adds a suspension of harvested microLED devices to a transparent first container. Step 2404 agitates the suspension. Some examples of an agitation process include external vibration of the first container, creating a fluid flow in the suspension, and flowing a gas through the first container. Step 2406 optically measures the suspension opacity at a plurality of first container heights. Step 2408 determines suspension homogeneity in response to the optical measurements. In response to determining a homogeneity greater than a homogeneity minimum threshold, Step 2410 disperses the suspension on a top surface of an emissive display panel.

In one aspect, Step 2401*a* determines the number of harvested microLED devices. For example, the number of microLEDs harvested from a carrier substrate may be known. Step 2409*a* calculates the number of microLED devices per unit of suspension volume, and dispersing the suspension on the top surface of the emissive display panel in Step 2410 includes depositing a known first number of microLED devices in response to dispersing a first volume of suspension.

In one aspect, optically measuring the suspension opacity at a plurality of first container heights in Step 2406 includes substeps. Step 2406*a* arranges a plurality of light emitting devices having predetermined output light intensity, directed towards a center axis of the first container and spaced a first predetermined distance from each other along a first vertical axis. Step 2406*b* arranges a plurality of light detection devices spaced the first predetermined distance from each other along a second vertical axis, with each light detection device having an input directed towards a corresponding light emitting device output. Step 2406*c* compares the intensities of light received by the light detection devices.

As an alternative to starting the process with a known number of microLEDs (Step 2401*a*), Step 2409*a* calculates a first number of microLED devices per unit of suspension volume in response to determining suspension homogeneity in Step 2408. Step 2412 changes the proportion of fluid-to-LED devices in the suspension by a predetermined amount of fluid, and Step 2414 optically measures the suspension opacity to calculate a second number of microLED devices per unit of suspension volume.

Dispersing the suspension on the emissive display panel in Step 2410 includes using one of the following dispersion processes: single-step mass decantation, multi-step pipette translation, nozzle limited container translation, and translating tube. The multi-step pipette transversal dispersal process includes the following substeps. Step 2410*a* maintains the suspension homogeneity greater than the homogeneity minimum threshold in the first container. Step 2410*b* uses a pipette to repeatedly draw a predetermined aliquot volume from the first container. After each aliquot draw, Step 2410*c* translates the pipette a predetermined distance with respect to the emissive panel top surface. Step 2410*d* releases a predetermined amount of aliquot per second during the translation.

In another aspect, the first container is pressure controlled and includes a nozzle, and the nozzle limited container translation dispersal process includes the following substeps. Step 2410*e* maintains the suspension homogeneity greater than the homogeneity minimum threshold in the first container. Step 2410*f* translates the first container a predetermined distance with respect to the emissive panel top surface, and Step 2410*g* releases a predetermined amount of suspension per second from the nozzle during the translation.

In one aspect, the first container is pressure controlled and includes an output port connected to one or more delivery tubes, and the translating tube dispersal process includes the following substeps. Step 2410*h* maintains the suspension homogeneity greater than the homogeneity minimum threshold in the first container. Step 2410*i* translates the delivery tube(s) a predetermined distance with respect to the emissive panel top surface, and Step 2410*j* releases a predetermined amount of suspension per second from the delivery tube(s) during the translation.

The single-step mass decantation dispersal process includes the following substeps. Step 2410*k* maintains the suspension homogeneity greater than the homogeneity minimum threshold in the first container, and Step 2410*m* releases the suspension from the first container onto an emissive panel top surface region using a fixed position center region release or a region translation release.

In one aspect, Step 2401*b* determines the number of assembly sites in a first region of the emissive display panel top surface. Then, dispersing the suspension on the top surface of the emissive display panel in Step 2410 includes depositing a first number of microLED devices at least equal to the number of assembly sites in the first region.

In another aspect, Step 2409*b* determines a number of translating path iterations for a first region of the emissive display panel, and Step 2409*c* determines a translation speed. Then, dispersing the suspension in Step 2410 includes calculating the rate at which the first volume of suspension is dispersed in response to the number of path iterations and translation speed, to create a uniform density of suspension over the emissive display panel first region.

Figure 25:
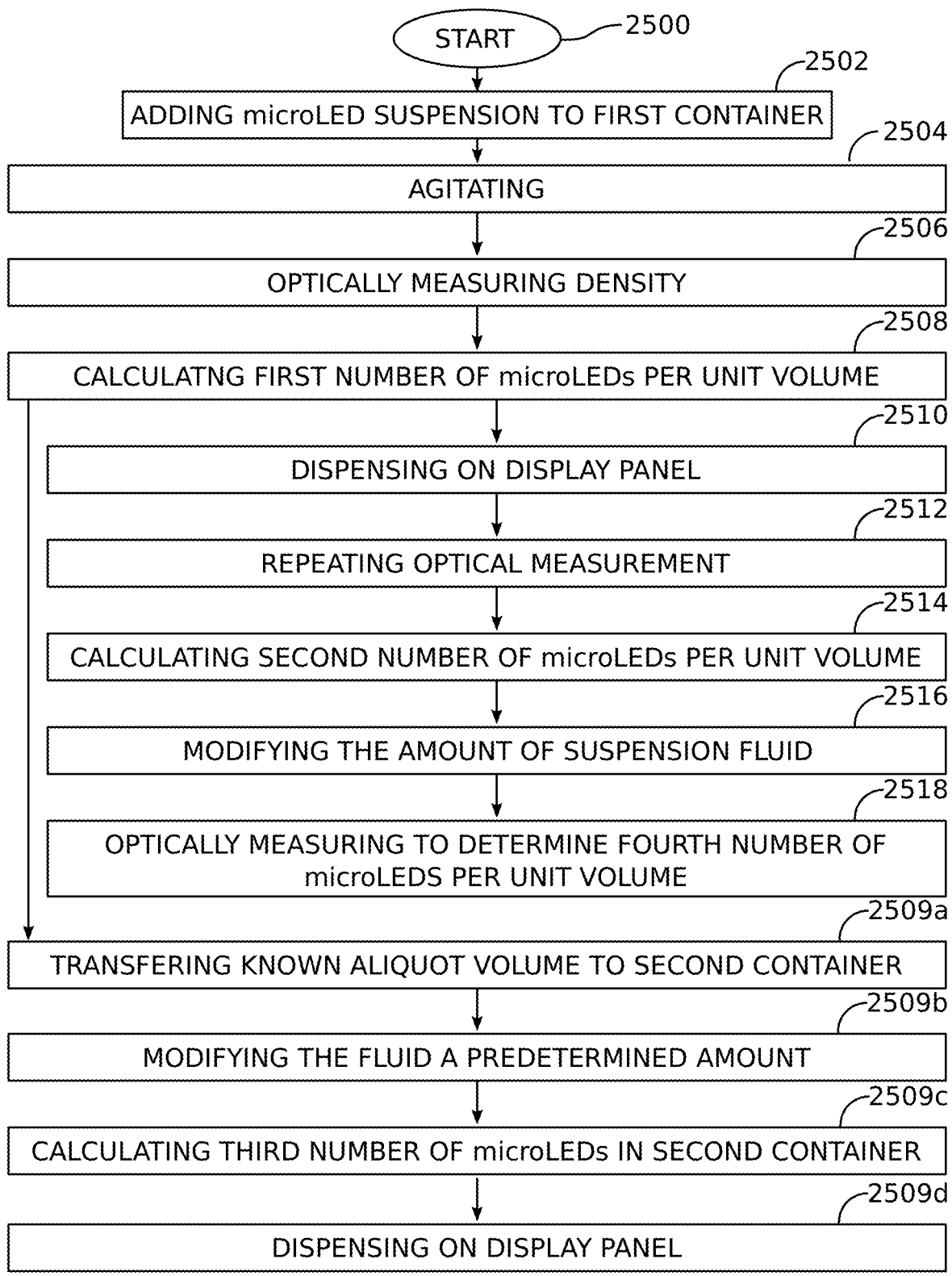
FIG. 25 is a flowchart illustrating a second method for the dispersal of microLED devices on an emissive display panel.

FIG. 25 is a flowchart illustrating a second method for the dispersal of microLED devices on an emissive display panel. The method begins at Step 2500. Step 2502 adds a suspension of harvested microLED devices to a transparent first container. Step 2504 agitates the suspension. Step 2506 optically measures the suspension density at a plurality of first container heights. Step 2508 calculates a first number of microLED devices per unit of suspension volume in response to the optical measurements. Step 2510 disperses an aliquot volume of suspension onto an emissive display panel top surface. Step 2512 repeats the optical measurement, and Step 2514 calculates a second number of microLED devices per unit of suspension volume.

In one aspect, Step 2509*a* transfers a known aliquot volume of suspension to a second container. Step 2509*b* modifies the amount of fluid in the second container by a predetermined amount, and Step 2509*c* calculates a third number of microLED devices per unit of suspension in the second container. Step 2509*d* disperses the suspension in the second container onto an emissive display panel top surface.

In another aspect, Step 2516 modifies the amount of suspension fluid in the first container, and subsequent to agitating the suspension, Step 2518 optically measures the suspension density to calculate a fourth number of microLED devices per unit of suspension volume.

Systems and methods have been provided for harvesting and dispersing microLEDs. Examples of particular process steps and hardware units have been presented to illustrate the invention. However, the invention is not limited to merely these examples. Other variations and embodiments of the invention will occur to those skilled in the art.

We claim:

1. A system for characterizing a micro light emitting diode (microLED) suspension comprising;
   a transparent container having a vertical center axis;
   a plurality of light emitting devices having a predetermined output light intensity, directed towards the center axis of the container and spaced a first predetermined distance from each other along a vertical first axis parallel to the center axis;
   a plurality of light detection devices spaced the first predetermined distance from each other along a vertical second axis parallel to the center axis, with each light detection device having an input directed towards a corresponding light emitting device output and an output to provide an electrical optical density signal responsive to measured light intensity;
   and, a monitoring device having an input to accept the optical density signals, the monitoring device comparing the intensities of light associated with the optical density signals and supplying an output responsive to the comparison;

wherein the container includes a suspension of microLEDs;

and, wherein the monitoring device supplies an output selected from the group consisting of a microLED homogeneity measurement and a calculation of a microLED count per unit volume of suspension.

2. The system of claim 1 wherein the monitoring device includes a non-transitory memory with a stored calibration curve and supplies a microLED count per unit volume of suspension in response to comparing the optical density signals to the calibration curve.

3. The system of claim 1 wherein the monitoring device has an input to accept a calibration input signal representing the total number of microLEDs in the suspension and supplies a microLED count per unit volume of suspension in response to comparing the optical density signals to the total number of microLEDs.

4. The system of claim 1 wherein the monitoring device accepts sets of optical density signals collected over a period of time and supplies an output selected from the group consisting of microLED settling time and microLED size.

5. The system of claim 1 wherein the container is divided by a plurality of graduations and includes a homogeneous suspension of microLEDs;

wherein the light detection devices detect changes in the level of suspension as measured against the container graduations; and, wherein the monitoring device supplies an output selected from the group consisting of a number of microLED devices dispersed from the container and a volume of suspension dispersed from the container.

\* \* \* \* \*